United States Patent
Park et al.

(10) Patent No.: US 11,380,265 B2
(45) Date of Patent: Jul. 5, 2022

(54) SCAN DRIVER AND DISPLAY DEVICE INCLUDING THE SAME

(71) Applicant: SAMSUNG DISPLAY CO., LTD., Yongin-si (KR)

(72) Inventors: Junhyun Park, Suwon-si (KR); Cheolgon Lee, Suwon-si (KR); Yang-Hwa Choi, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 45 days.

(21) Appl. No.: 16/404,888

(22) Filed: May 7, 2019

(65) Prior Publication Data

US 2019/0347997 A1 Nov. 14, 2019

(30) Foreign Application Priority Data

May 8, 2018 (KR) .................. 10-2018-0052517

(51) Int. Cl.
  *G11C 19/00* (2006.01)
  *G09G 3/3266* (2016.01)
  *G11C 19/28* (2006.01)

(52) U.S. Cl.
  CPC .......... *G09G 3/3266* (2013.01); *G11C 19/28* (2013.01); *G09G 2300/0819* (2013.01); *G09G 2310/0286* (2013.01)

(58) Field of Classification Search
  None
  See application file for complete search history.

(56) References Cited

U.S. PATENT DOCUMENTS

| | | | |
|---|---|---|---|
| 9,805,820 B2* | 10/2017 | In | G09G 3/20 |
| 10,235,926 B2* | 3/2019 | In | G09G 3/3266 |
| 2014/0118236 A1* | 5/2014 | Jin | G11C 19/28 |
| | | | 345/93 |

(Continued)

FOREIGN PATENT DOCUMENTS

| | | |
|---|---|---|
| KR | 1020130137860 | 12/2013 |
| KR | 1020150012095 | 2/2015 |

(Continued)

OTHER PUBLICATIONS

Office Action dated Apr. 27, 2022 in related Korean Patent Application No. 10-2018-0052517, 7 pages (in Korean).

*Primary Examiner* — Tuan T Lam
(74) *Attorney, Agent, or Firm* — F. Chau & Associates, LLC

(57) ABSTRACT

A scan driver includes a plurality of stages, each including a first input part configured to transfer an input signal to a first set node in response to a second clock signal, a second input part configured to transfer a first clock signal to a first reset node in response to the input signal and the second clock signal, a first output part configured to output a third clock signal as a respective scan signal in response to a voltage of a second set node, a second output part configured to output a concurrent driving signal as the respective scan signal in response to a voltage of a second reset node, a first stress relieving transistor connected between the first set node and the second set node, and a second stress relieving transistor connected between the first reset node and the second reset node.

17 Claims, 14 Drawing Sheets

(56) References Cited

U.S. PATENT DOCUMENTS

| | | | |
|---|---|---|---|
| 2015/0035732 A1* | 2/2015 | Lee | G09G 3/3266 |
| | | | 345/76 |
| 2015/0106646 A1* | 4/2015 | Lee | G09G 3/3677 |
| | | | 713/400 |
| 2016/0035262 A1* | 2/2016 | Lee | G09G 3/3266 |
| | | | 345/690 |
| 2016/0210925 A1* | 7/2016 | Chung | G09G 3/3266 |
| 2017/0084222 A1* | 3/2017 | Sun | G09G 3/32 |

FOREIGN PATENT DOCUMENTS

| | | |
|---|---|---|
| KR | 1020160029488 | 3/2016 |
| KR | 10-2016-0057512 | 5/2016 |

* cited by examiner

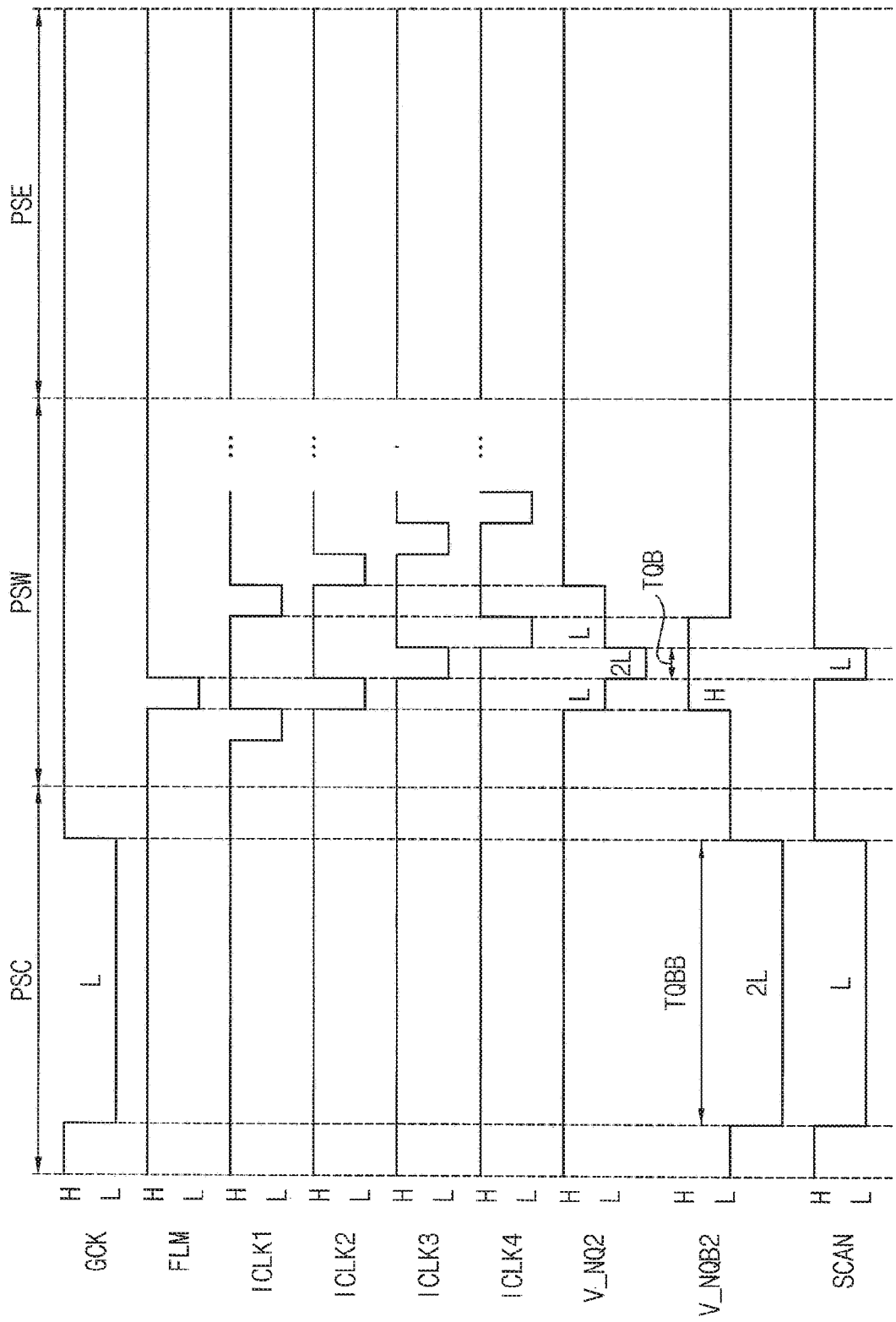

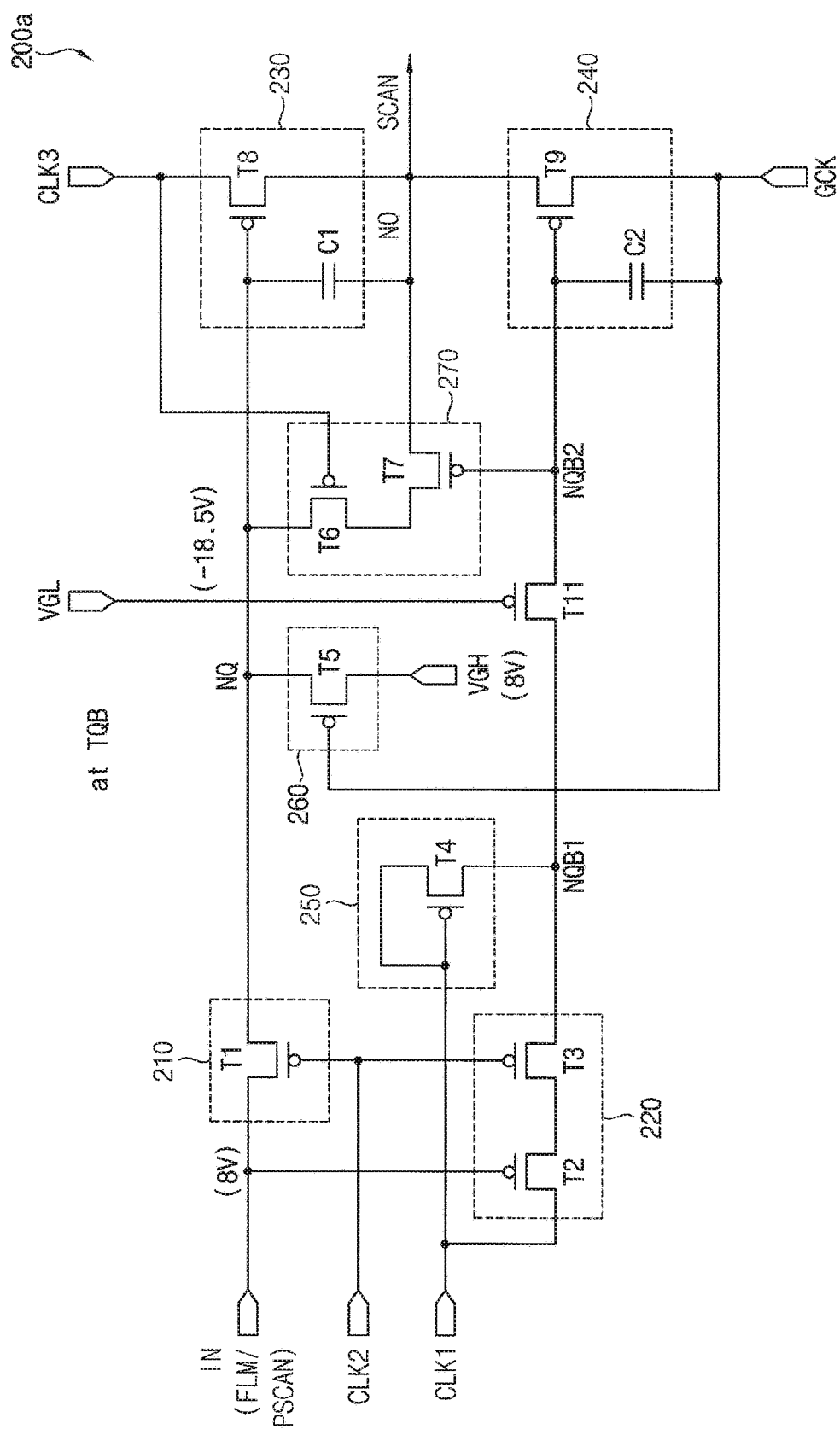

SCAN DRIVER AND DISPLAY DEVICE INCLUDING THE SAME

CROSS-REFERENCE TO RELATED APPLICATION

This application claims priority under 35 U.S.C. § 119 to Korean Patent Application No. 10-2018-0052517, filed on May 8, 2018 in the Korean Intellectual Property Office (KIPO), the disclosure of which is incorporated by reference herein in its entirety.

TECHNICAL FIELD

Exemplary embodiments of the inventive concept relate generally to display devices, and more particularly, to scan drivers and display devices including the scan drivers.

DISCUSSION OF RELATED ART

Generally, a display device may include a display panel, a data driver providing data signals to the display panel, and a scan driver providing scan signals to the display panel. The scan driver may include a plurality of stages respectively outputting the scan signals. Each stage may include transistors for boosting a voltage of a set node (which may be referred to as a Q node) and/or a voltage of a reset node (which may be referred to as a QB node) and for outputting a respective scan signal in response to the boosted voltage. When the voltage of the set node and/or the voltage of the reset node are boosted, a high drain-source voltage or a drain-source voltage stress may be applied to at least a portion of the transistors included in each stage, and thus the transistor to which the drain-source voltage stress is applied may be degraded.

SUMMARY

According to an exemplary embodiment of the inventive concept, a scan driver includes a plurality of stages respectively outputting a plurality of scan signals. Each of the plurality of stages includes a first input part configured to transfer an input signal to a first set node in response to a second clock signal, a second input part configured to transfer a first clock signal to a first reset node in response to the input signal and the second clock signal, a first output part configured to output a third clock signal as a respective scan signal in response to a voltage of a second set node, a second output part configured to output a concurrent driving signal as the respective scan signal in response to a voltage of a second reset node, a first stress relieving transistor connected between the first set node and the second set node, and a second stress relieving transistor connected between the first reset node and the second reset node.

In an exemplary embodiment of the inventive concept, the first stress relieving transistor may be configured to allow an absolute value of a voltage of the first set node to be lower than an absolute value of the voltage of the second set node when the voltage of the second set node is boosted in a data writing period.

In an exemplary embodiment of the inventive concept, the second stress relieving transistor may be configured to allow an absolute value of a voltage of the first reset node to be lower than an absolute value of the voltage of the second reset node when the voltage of the second reset node is boosted in a concurrent compensation period.

In an exemplary embodiment of the inventive concept, the first stress relieving transistor and the second stress relieving transistor may be turned on in response to a gate on voltage while the scan driver is powered on.

In an exemplary embodiment of the inventive concept, the first stress relieving transistor may include a gate configured to receive a gate on voltage, a first terminal connected to the first set node, and a second terminal connected to the second set node.

In an exemplary embodiment of the inventive concept, the second stress relieving transistor may include a gate configured to receive a gate on voltage, a first terminal connected to the first reset node, and a second terminal connected to the second reset node.

In an exemplary embodiment of the inventive concept, the first input part may include a first transistor including a gate configured to receive the second clock signal, a first terminal configured to receive the input signal, and a second terminal connected to the first set node.

In an exemplary embodiment of the inventive concept, the second input part may include a second transistor including a gate configured to receive the input signal, a first terminal configured to receive the first clock signal, and a second terminal, and a third transistor including a gate configured to receive the second clock signal, a first terminal connected to the second terminal of the second transistor, and a second terminal connected to the first reset node.

In an exemplary embodiment of the inventive concept, each of the plurality of stages may further include a holding part configured to hold a voltage of the first reset node in response to the first clock signal.

In an exemplary embodiment of the inventive concept, the holding part may include a fourth transistor including a gate configured to receive the first clock signal, a first terminal configured to receive the first clock signal, and a second terminal connected to the first reset node.

In an exemplary embodiment of the inventive concept, each of the plurality of stages may further include a concurrent driving controlling part configured to deactivate the first output part in response to the concurrent driving signal.

In an exemplary embodiment of the inventive concept, the concurrent driving controlling part may include a fifth transistor including a gate configured to receive the concurrent driving signal, a first terminal configured to receive a gate off voltage, and a second terminal connected to the first set node.

In an exemplary embodiment of the inventive concept, each of the plurality of stages may further include a stabilizing part configured to stabilize the respective scan signal in response to the voltage of the second reset node and the third clock signal.

In an exemplary embodiment of the inventive concept, the stabilizing part may include a sixth transistor including a gate configured to receive the third clock signal, a first terminal connected to the first set node, and a second terminal, and a seventh transistor including a gate connected to the second reset node, a first terminal connected to the second terminal of the sixth transistor, and a second terminal connected to an output node.

In an exemplary embodiment of the inventive concept, the first output part may include an eighth transistor including a gate connected to the second set node, a first terminal configured to receive the third clock signal, and a second terminal connected to an output node, and a first capacitor including a first electrode connected to the second set node and a second electrode connected to the output node.

In an exemplary embodiment of the inventive concept, the second output part may include a ninth transistor including a gate connected to the second reset node, a first terminal configured to receive the concurrent driving signal, and a second terminal connected to an output node, and a second capacitor including a first electrode connected to the second reset node and a second electrode configured to receive the concurrent driving signal.

According to an exemplary embodiment of the inventive concept, a scan driver includes a plurality of stages respectively outputting a plurality of scan signals. Each of the plurality of stages includes a first transistor including a gate configured to receive a second clock signal, a first terminal configured to receive an input signal, and a second terminal connected to a first set node, a second transistor including a gate configured to receive the input signal, a first terminal configured to receive a first clock signal, and a second terminal, a third transistor including a gate configured to receive the second clock signal, a first terminal connected to the second terminal of the second transistor, and a second terminal connected to a first reset node, an eighth transistor including a gate connected to a second set node, a first terminal configured to receive a third clock signal, and a second terminal connected to an output node, a first capacitor including a first electrode connected to the second set node and a second electrode connected to the output node, a ninth transistor including a gate connected to a second reset node, a first terminal configured to receive a concurrent driving signal, and a second terminal connected to the output node, a second capacitor including a first electrode connected to the second reset node and a second electrode configured to receive the concurrent driving signal, a tenth transistor including a gate configured to receive a gate on voltage, a first terminal connected to the first set node, and a second terminal connected to the second set node, and an eleventh transistor including a gate configured to receive the gate on voltage, a first terminal connected to the first reset node, and a second terminal connected to the second reset node.

In an exemplary embodiment of the inventive concept, the tenth transistor may be configured to allow an absolute value of a voltage of the first set node to be lower than an absolute value of a voltage of the second set node when the voltage of the second set node is boosted in a data writing period, and the eleventh transistor may be configured to allow an absolute value of a voltage of the first reset node to be lower than an absolute value of a voltage of the second reset node when the voltage of the second reset node is boosted in a concurrent compensation period.

In an exemplary embodiment of the inventive concept, each of the plurality of stages may further include a fourth transistor including a gate configured to receive the first clock signal, a first terminal configured to receive the first clock signal, and a second terminal connected to the first reset node, a fifth transistor including a gate configured to receive the concurrent driving signal, a first terminal configured to receive a gate off voltage, and a second terminal connected to the first set node, a sixth transistor including a gate configured to receive the third clock signal, a first terminal connected to the first set node, and a second terminal, and a seventh transistor including a gate connected to the second reset node, a first terminal connected to the second terminal of the sixth transistor, and a second terminal connected to the output node.

According to an exemplary embodiment of the inventive concept, a display device includes a display panel including a plurality of data lines, a plurality of scan lines, and a plurality of pixels connected to the plurality of data lines and the plurality of scan lines, a data driver configured to output data signals to the plurality of data lines, a scan driver including a plurality of stages respectively outputting a plurality of scan signals to the plurality of scan lines. Each of the plurality of stages includes a first input part configured to transfer an input signal to a first set node in response to a second clock signal, a second input part configured to transfer a first clock signal to a first reset node in response to the input signal and the second clock signal, a first output part configured to output a third clock signal as a respective scan signal in response to a voltage of a second set node, a second output part configured to output a concurrent driving signal as the respective scan signal in response to a voltage of a second reset node, a first stress relieving transistor connected between the first set node and the second set node, and a second stress relieving transistor connected between the first reset node and the second reset node.

BRIEF DESCRIPTION OF THE DRAWINGS

The above and other features of the inventive concept will be more clearly understood by describing in detail exemplary embodiments thereof with reference to the accompanying drawings.

FIG. 5 is a timing diagram for describing an operation of the scan driver of FIG. 4 according to an exemplary embodiment of the inventive concept.

FIG. 6A is a diagram for describing a drain-source voltage stress in a stage excluding a first stress relieving transistor when a voltage of a set node is boosted.

DETAILED DESCRIPTION OF THE EMBODIMENTS

Figure 1:
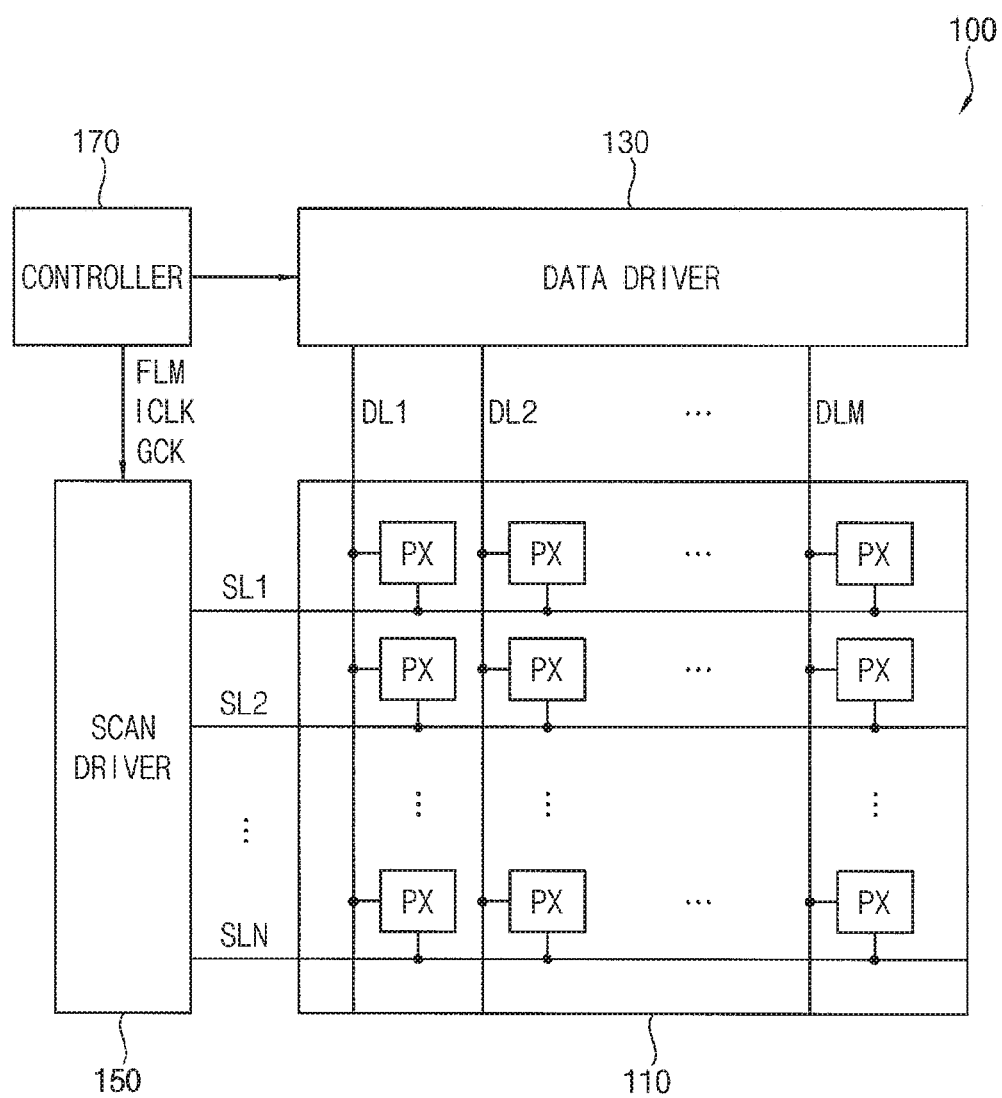
FIG. 1 is a block diagram illustrating a display device according to an exemplary embodiment of the inventive concept.

Exemplary embodiments of the inventive concept provide a scan driver capable of relieving a drain-source voltage stress.

Exemplary embodiments of the inventive concept also provide a display device including the scan driver capable of relieving a drain-source voltage stress.

Exemplary embodiments of the inventive concept are described more fully hereinafter with reference to the accompanying drawings. Like or similar reference numerals may refer to like or similar elements throughout this application.

Figure 2:
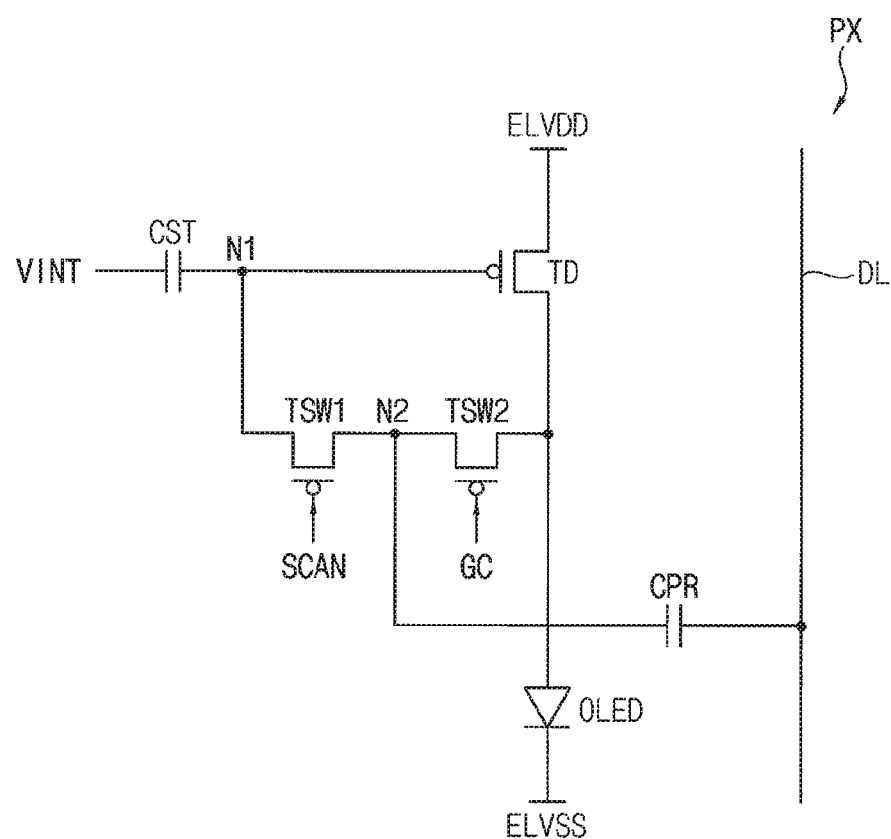
FIG. 2 is a circuit diagram illustrating a pixel included in the display device of FIG. 1 according to an exemplary embodiment of the inventive concept.
Figure 3:
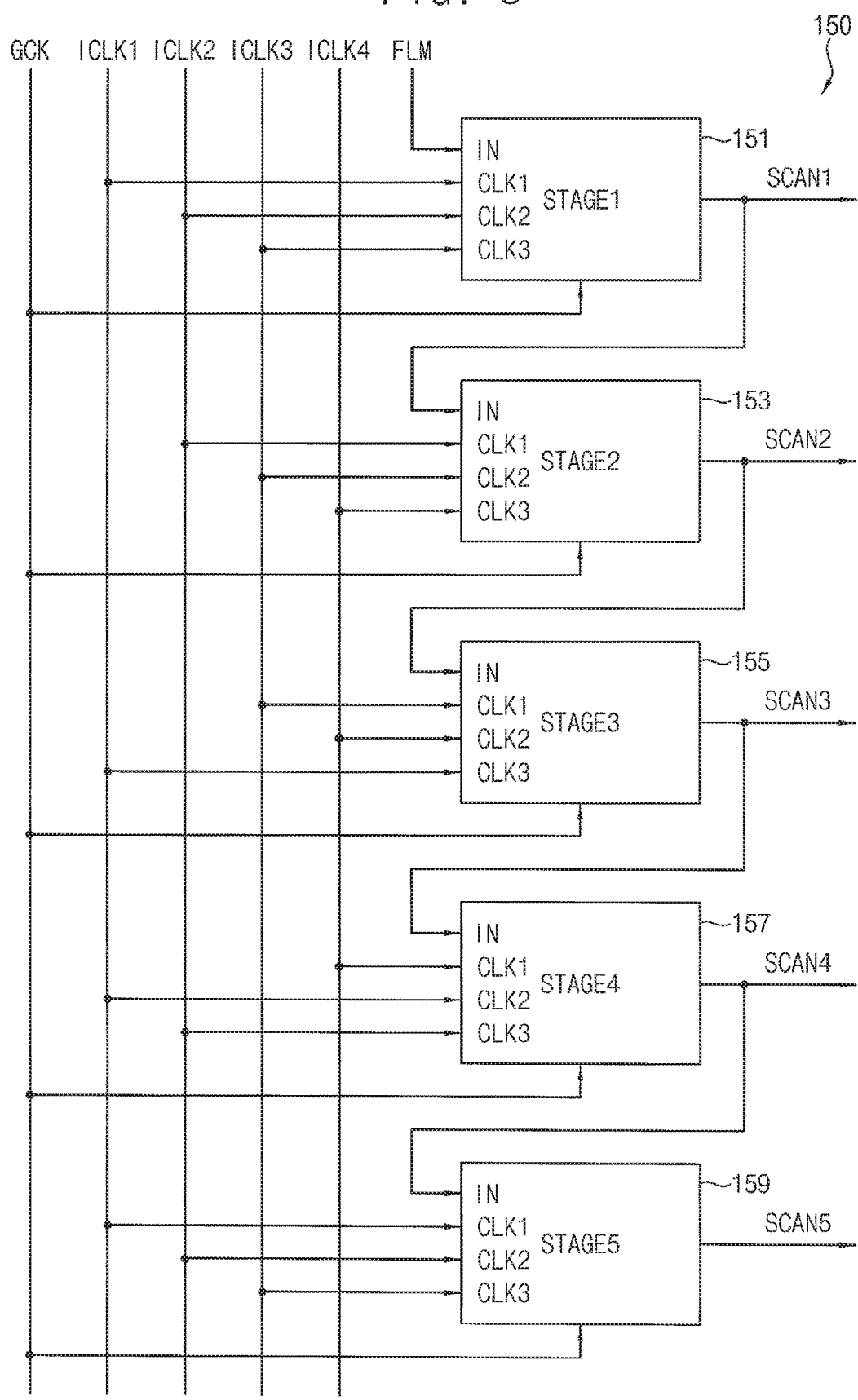
FIG. 3 is a block diagram illustrating a scan driver included in the display device of FIG. 1 according to an exemplary embodiment of the inventive concept.

FIG. 1 is a block diagram illustrating a display device according to an exemplary embodiment of the inventive concept, FIG. 2 is a circuit diagram illustrating a pixel included in the display device of FIG. 1 according to an exemplary embodiment of the inventive concept, and FIG. 3 is a block diagram illustrating a scan driver included in the display device of FIG. 1 according to an exemplary embodiment of the inventive concept.

Referring to FIG. 1, a display device 100 may include a display panel 110, a data driver 130 providing data signals to the display panel 110, and a scan driver 150 providing scan signals to the display panel 110. In an exemplary embodiment of the inventive concept, the display device 100 may further include a controller (e.g., a timing controller) 170 controlling the data driver 130 and the scan driver 150.

The display panel 110 may include a plurality of data lines DL1, DL2, and DLM, a plurality of scan lines SL1, SL2, . . . and SLN, and a plurality of pixels PX connected to the data lines DL1, DL2, . . . and DLM and the scan lines SL1, SL2, . . . and SLN. In an exemplary embodiment of the inventive concept, the display panel 110 may be an organic light emitting diode display panel where each pixel PX includes an organic light emitting diode, but is not limited thereto. For example, the display panel 110 may be a liquid crystal display (LCD) panel, or the like.

In an exemplary embodiment of the inventive concept, as illustrated in FIG. 2, each pixel PX may have a 3T2C structure including three transistors TD, TSW1, and TSW2 and two capacitors CST and CPR. For example, each pixel PX may include a storage capacitor CST having a first electrode receiving an initialization voltage VINT and a second electrode connected to a first node N1, a driving transistor TD having a gate connected to the first node N1, a source receiving a high power supply voltage ELVDD, and a drain connected to an organic light emitting diode OLED, a first switching transistor TSW1 having a gate receiving a scan signal SCAN, a source connected to a second node N2, and a drain connected to the first node N1, a second switching transistor TSW2 having a gate receiving a global control signal GC, a source connected to the drain of the driving transistor TD, and a drain connected to the second node N2, a program capacitor CPR having a first electrode connected to the data line DL and a second electrode connected to the second node N2, and the organic light emitting diode OLED having an anode connected to the drain of the driving transistor TD and a cathode receiving a low power supply voltage ELVSS. Although FIG. 2 illustrates an example of the pixel PX having the 3T2C structure, a structure of the pixel PX of the display device 100 according to exemplary embodiments of the inventive concept may not be limited to the 3T2C structure. For example, the pixel PX may have another 3T2C structure having connections different from those of the example of FIG. 2, or may have any structure including two or more transistors and one or more capacitors.

In an exemplary embodiment of the inventive concept, the display device 100 may be driven in a concurrent (e.g., simultaneous) driving manner where each frame includes a concurrent compensation period, a data driving period, and a concurrent emission period. In the concurrent compensation period, the plurality of pixels PX included in the display panel 110 may concurrently (or simultaneously) perform threshold voltage compensation operations. In the data driving period, the data signals are sequentially written to the plurality of pixels PX on a row-by-row basis. In the concurrent emission period, the plurality of pixels PX may concurrently (or simultaneously) emit light.

For example, in the concurrent compensation period, the plurality of scan signals SCAN and the global control signal GC may be applied to the plurality of pixels PX, the first and second switching transistors TSW1 and TSW2 of the plurality of pixels PX may be turned on in response to the plurality of scan signals SCAN and the global control signal GC, and the driving transistors TD of the plurality of pixels PX may be diode-connected by the turned-on first and second switching transistors TSW1 and TSW2 to store threshold voltages of the driving transistors TD in the storage capacitors CST.

In the data writing period, the plurality of scan signals SCAN may be sequentially applied to the plurality of pixels PX on the row-by-row basis, the first switching transistor TSW1 of each pixel PX may be turned on in response to the scan signal SCAN, and the data signal applied through the data line DL may be stored through charge sharing between the program capacitor CPR and the storage capacitor CST in each pixel PX. Since the threshold voltage has been stored in the storage capacitor CST of each pixel PX in the concurrent compensation period, the data signal where the threshold voltage is compensated may be stored in the storage capacitor CST in the data writing period.

In the concurrent emission period, the driving transistors TD of the plurality of pixels PX may generate driving currents, and the organic light emitting diodes OLED of the plurality of pixels PX may concurrently (or simultaneously) emit light based on the driving currents. However, the display device 100 according to exemplary embodiments of the inventive concept may be driven with any frame including the concurrent compensation period. For example, each frame of the display device 100 may include the concurrent compensation period, the data driving period, and a progressive emission period. In another example, each frame of the display device 100 may include, along with the concurrent compensation period, the data driving period, and the concurrent/progressive emission period, an on bias period in which an on bias is applied to the driving transistors TD, and/or an initialization period in which gates of the driving transistors TD, anodes of the organic light emitting diodes OLED, and/or the second nodes N2 are initialized.

The data driver 130 may output data signals to data lines DL1, DL2, . . . and DLM based on a data control signal and image data from the controller 170. In an exemplary embodiment of the inventive concept, the data driver 130 may provide the data signals to the plurality of pixels PX through the data lines DL1, DL2, . . . and DLM in the data writing period.

The scan driver 150 may output scan signals SCAN to scan lines SL1, SL2, . . . and SLN based on a gate control signal from the controller 170. In an exemplary embodiment of the inventive concept, the gate control signal may include a start signal FLM, an input clock signal ICK, and a concurrent driving signal GCK. In an exemplary embodiment of the inventive concept, the scan driver 150 may concurrently (or simultaneously) provide the scan signals SCAN to the plurality of pixels PX through the scan lines SL1, SL2, . . . and SLN in response to the concurrent driving signal GCK in the concurrent compensation period, and may sequentially provide the scan signals SCAN to the plurality of pixels PX through the scan lines SL1, SL2, . . . and SLN on a row-by-row basis in response to the input clock signal ICK in the data writing period.

In an exemplary embodiment of the inventive concept, as illustrated in FIG. 3, the scan driver 150 may receive the start signal FLM, first through fourth input clock signals ICLK1, ICLK2, ICLK3, and ICLK4, and the concurrent driving signal GCK, and may include a plurality of stages 151, 153, 155, 157, and 159 respectively outputting a plurality of scan signals SCAN1, SCAN2, SCAN3, SCAN4, and SCAN5 to the scan lines SL1, SL2, . . . and SLN.

Each stage 151, 153, 155, 157, and 159 may receive, as an input signal IN, the start signal FLM or a previous scan signal. For example, a first stage 151 may receive the start signal FLM as the input signal IN, and other stages 153, 155, 157, and 159 may receive, as the input signal IN, the scan signals SCAN1, SCAN2, SCAN3, and SCAN4 of their previous stages 151, 153, 155, and 157.

Further, four adjacent stages (e.g., 151, 153, 155, and 157) may receive, as first through third clock signals CLK1, CLK2, and CLK3, different sets of three signals among the first through fourth input clock signals ICLK1, ICLK2, ICLK3, and ICLK4 that are sequentially activated. For example, the first stage 151 may receive the first through third input clock signals ICLK1, ICLK2, and ICLK3 as the first through third clock signals CLK1, CLK2, and CLK3, respectively, a second stage 153 may receive the second through fourth input clock signals ICLK2, ICLK3, and ICLK4 as the first through third clock signals CLK1, CLK2, and CLK3, respectively, a third stage 155 may receive the third, fourth, and first input clock signals ICLK3, ICLK4, and ICLK1 as the first through third clock signals CLK1, CLK2, and CLK3, respectively, and a fourth stage 157 may receive the fourth, first, and second input clock signals ICLK4, ICLK1, and ICLK2 as the first through third clock signals CLK1, CLK2, and CLK3, respectively. Similarly to the first stage 151, a fifth stage 159 may receive the first through third input clock signals ICLK1, ICLK2, and ICLK3 as the first through third clock signals CLK1, CLK2, and CLK3, respectively.

In an exemplary embodiment of the inventive concept, in the data writing period, each stage 151, 153, 155, 157, and 159 may receive the input signal IN in response to a pulse of the second clock signal CLK2, may output a next pulse of the third clock signal CLK3 as the scan signal SCAN1, SCAN2, SCAN3, SCAN4, and SCAN5. For example, the first stage 151 may output a pulse of the third input clock signal ICLK3 as a first scan signal SCAN1, then the second stage 153 may output a next pulse of the fourth input clock signal ICLK4 as a second scan signal SCAN2, then the third stage 155 may output a next pulse of the first input clock signal ICLK1 as a third scan signal SCAN3, then the fourth stage 157 may output a next pulse of the second input clock signal ICLK2 as a fourth scan signal SCAN4, and then the fifth stage 159 may output a next pulse of the third input clock signal ICLK3 as a fifth scan signal SCAN5. In this manner, the plurality of stages 151, 153, 155, 157, and 159 may sequentially output the plurality of scan signals SCAN1, SCAN2, SCAN3, SCAN4, and SCAN5 in response to the input clock signals ICLK1, ICLK2, ICLK3, and ICLK4 that are sequentially activated.

In an exemplary embodiment of the inventive concept, in the concurrent compensation period, the plurality of stages 151, 153, 155, 157, and 159 may concurrently receive the concurrent driving signal GCK, and may concurrently output the plurality of scan signals SCAN1, SCAN2, SCAN3, SCAN4, and SCAN5 in response to the concurrent driving signal GCK.

A voltage of a set node (or a Q node) of each stage 151, 153, 155, 157, and 159 may be boosted to output the scan signal SCAN in the data writing period, and voltages of reset nodes (or QB nodes) of the plurality of stages 151, 153, 155, 157, and 159 may be concurrently boosted to concurrently output the plurality of scan signals SCAN1, SCAN2, SCAN3, SCAN4, and SCAN5 in the concurrent compensation period. By this boosted voltage of the set node or the reset node, at least one transistor included in each stage 151, 153, 155, 157, and 159 may receive a drain-source voltage stress. In particular, although the voltage of the set node of each stage 151, 153, 155, 157, and 159 may be boosted for about 1H time in the data writing period, the voltages of the reset nodes of the plurality of stages 151, 153, 155, 157, and 159 may be boosted for, for example, about 100H time in the concurrent compensation period. Accordingly, the drain-source voltage stress in the concurrent compensation period of each frame may be accumulated, and thus at least one transistor of each stage 151, 153, 155, 157, and 159 may be degraded.

However, each stage 151, 153, 155, 157, and 159 of the scan driver 150 according to exemplary embodiments of the inventive concept may include a first stress relieving transistor located at the set node and a second stress relieving transistor located at the reset node. The first stress relieving transistor may lower an absolute value of a voltage applied to at least one transistor of each stage 151, 153, 155, 157, and 159 when the voltage of the set node is boosted in the data writing period, and the second stress relieving transistor may lower an absolute value of a voltage applied to at least one transistor of each stage 151, 153, 155, 157, and 159 when the voltage of the reset node is boosted in the concurrent compensation period. Accordingly, the drain-source voltage stress to at least one transistor of each stage 151, 153, 155, 157, and 159 may be relieved.

Figure 4:
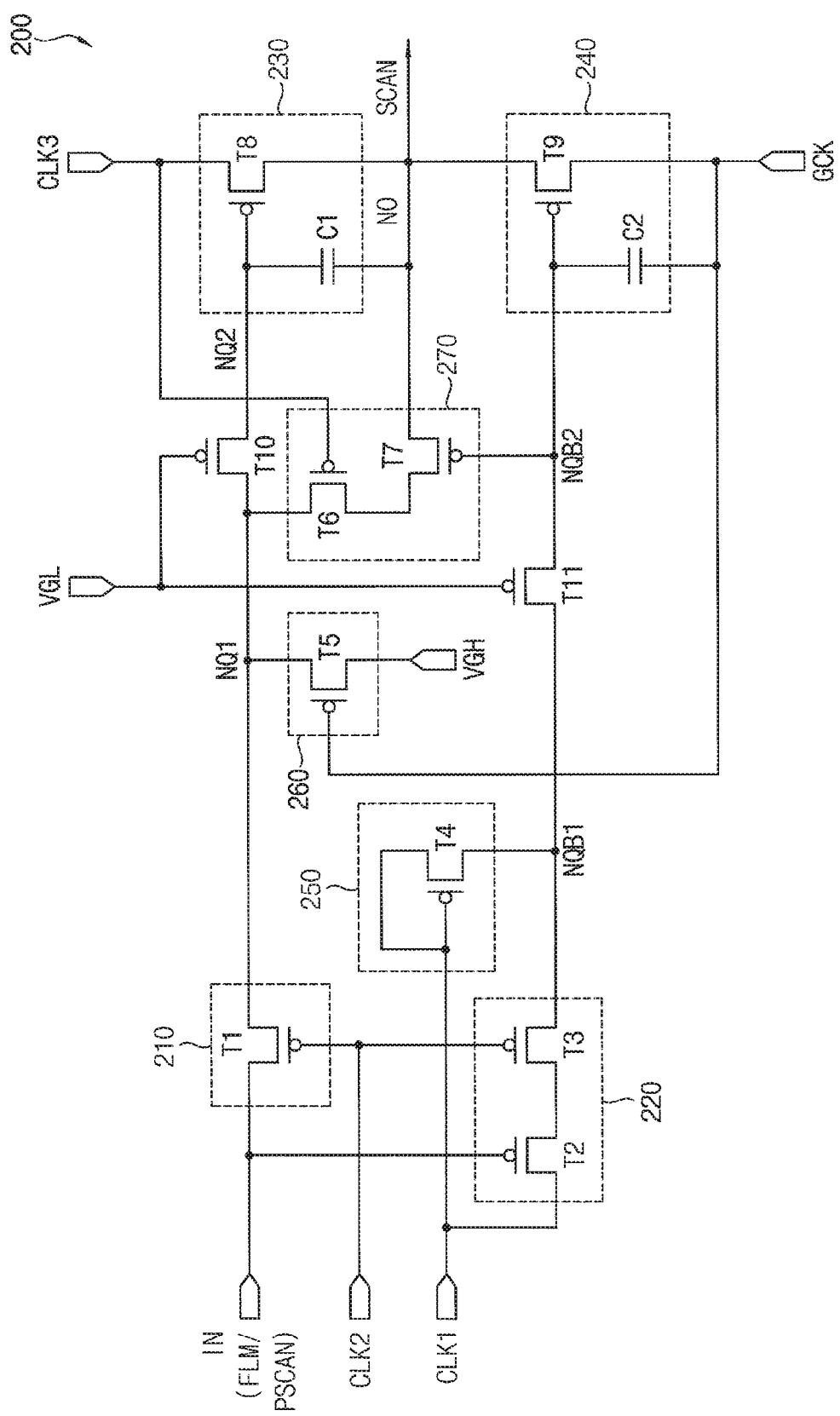
FIG. 4 is a circuit diagram illustrating a stage included in a scan driver according to an exemplary embodiment of the inventive concept.
Figure 6B:
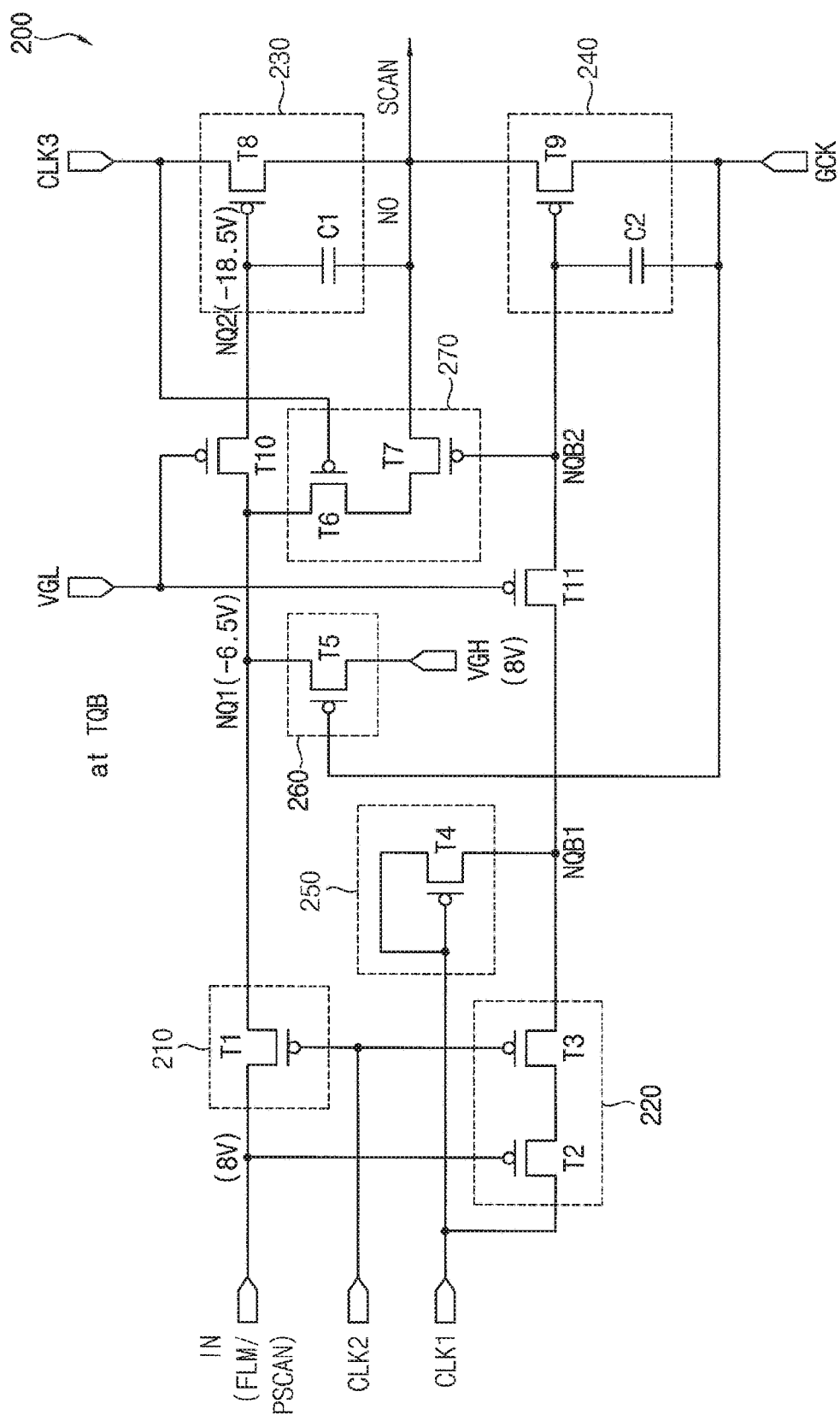
FIG. 6B is a diagram for describing a drain-source voltage stress in a stage according to an exemplary embodiment of the inventive concept when a voltage of a set node is boosted.
Figure 7A:
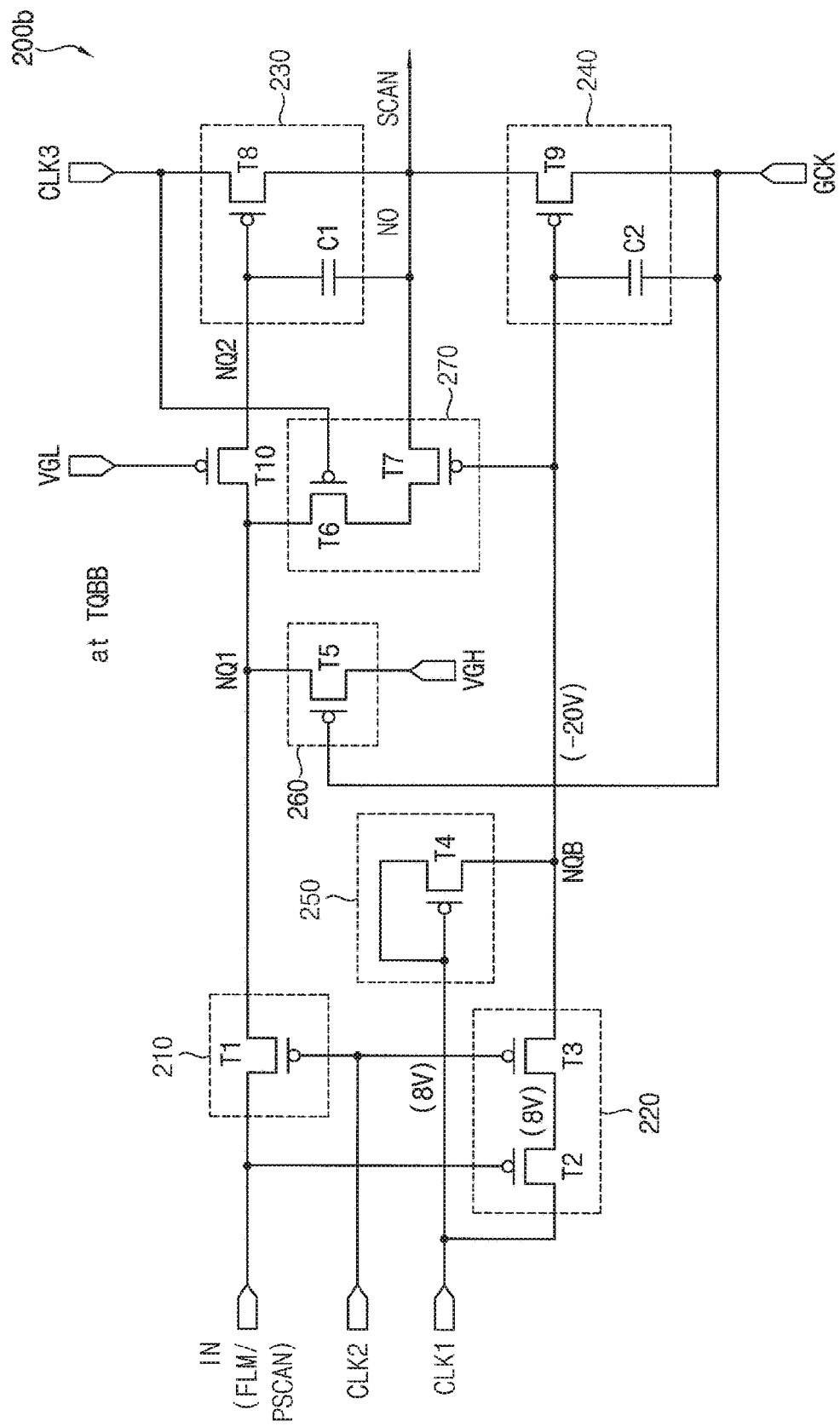
FIG. 7A is a diagram for describing a drain-source voltage stress in a stage excluding a second stress relieving transistor when a voltage of a reset node is boosted.
Figure 7B:
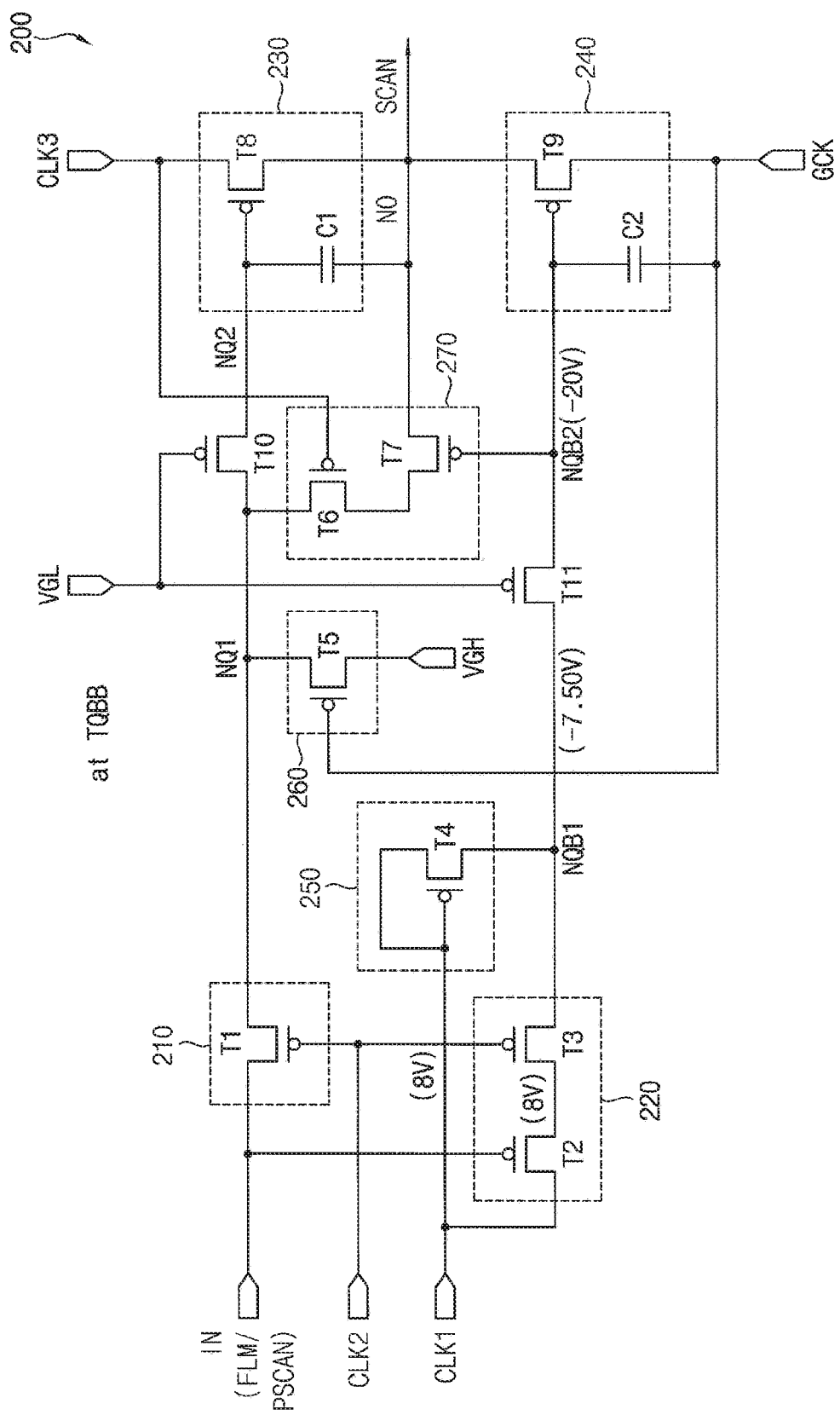
FIG. 7B is a diagram for describing a drain-source voltage stress in a stage according to an exemplary embodiment of the inventive concept when a voltage of a reset node is boosted.

FIG. 4 is a circuit diagram illustrating a stage included in a scan driver according to an exemplary embodiment of the inventive concept, FIG. 5 is a timing diagram for describing an operation of the scan driver of FIG. 4 according to an exemplary embodiment of the inventive concept, FIG. 6A is a diagram for describing a drain-source voltage stress in a stage excluding a first stress relieving transistor when a voltage of a set node is boosted, FIG. 6B is a diagram for describing a drain-source voltage stress in a stage according to an exemplary embodiment of the inventive concept when a voltage of a set node is boosted, FIG. 7A is a diagram for describing a drain-source voltage stress in a stage excluding a second stress relieving transistor when a voltage of a reset node is boosted, and FIG. 7B is a diagram for describing a drain-source voltage stress in a stage according to an exemplary embodiment of the inventive concept when a voltage of a reset node is boosted.

Referring to FIG. 4, each stage 200 included in a scan driver according to exemplary embodiments of the inventive concept may include a first input part 210, a second input part 220, a first output part 230, a second output part 240, a first stress relieving transistor T10, and a second stress relieving transistor T11. In an exemplary embodiment of the inventive concept, each stage 200 may further include a holding part 250, a concurrent driving controlling part 260, and a stabilizing part 270.

The first input part 210 may transfer the input signal IN to a first set node NQ1 in response to the second clock signal CLK2. For example, the first input part 210 of a first stage may receive the start signal FLM as the input signal IN, and the first input part 210 of each of remaining stages may receive a previous scan signal PSCAN as the input signal IN. In an exemplary embodiment of the inventive concept, the first input part 210 may include a first transistor T1 including a gate receiving the second clock signal CLK2, a first terminal receiving the input signal IN, and a second terminal connected to the first set node NQ1.

The second input part 220 may transfer the first clock signal CLK1 to a first reset node NQB1 in response to the input signal IN and the second clock signal CLK2. For example, when the input signal IN and the second clock signal CLK2 have active levels (or low levels in an example of FIG. 4), the second input part 220 may transfer the first clock signal CLK1 having an inactive level (or a high level in the example of FIG. 4) to the first reset node NQB1. In an exemplary embodiment of the inventive concept, the second input part 220 may include a second transistor T2 including a gate receiving the input signal IN, a first terminal receiving the first clock signal CLK1, and a second terminal, and a third transistor T3 including a gate receiving the second clock signal CLK2, a first terminal connected to the second terminal of the second transistor T2, and a second terminal connected to the first reset node NQB1.

The holding part 250 may hold a voltage of the first reset node NQB1 in response to the first clock signal CLK1. For example, the holding part 250 may hold the voltage of the first reset node NQB1 when the first clock signal CLK1 has the low level. In an exemplary embodiment of the inventive concept, the holding part 250 may include a fourth transistor T4 including a gate receiving the first clock signal CLK1, a first terminal receiving the first clock signal CLK1, and a second terminal connected to the first reset node NQB1.

The concurrent driving controlling part 260 may deactivate the first output part 230 in response to the concurrent driving signal GCK. In an exemplary embodiment of the inventive concept, the concurrent driving signal GCK may have the low level in the concurrent compensation period, and may have the high level in remaining periods (e.g., the data writing period and the concurrent emission period). In the concurrent compensation period, the concurrent driving controlling part 260 may transfer a gate off voltage VGH (or a high gate voltage VGH) having the high level to the first set node NQ1 in response to the concurrent driving signal GCK. The gate off voltage VGH of the first set node NQ1 may be transferred by the first stress relieving transistor T10 to a second set node NQ2, and the first output part 230 may be deactivated by the gate off voltage VGH of the second set node NQ2. In an exemplary embodiment of the inventive concept, the concurrent driving controlling part 260 may include a fifth transistor T5 including a gate receiving the concurrent driving signal GCK, a first terminal receiving the gate off voltage VGH, and a second terminal connected to the first set node NQ1.

The stabilizing part 270 may stabilize the scan signal SCAN in response to a voltage of a second reset node NQB2 and the third clock signal CLK3. For example, when the voltage of the second reset node NQB2 and the third clock signal CLK3 have the low levels, the stabilizing part 270 may stabilize the scan signal SCAN to the high level. In an exemplary embodiment of the inventive concept, the stabilizing part 270 may include a sixth transistor T6 including a gate receiving the third clock signal CLK3, a first terminal connected to the first set node NQ1, and a second terminal, and a seventh transistor T7 including a gate connected to the second reset node NQB2, a first terminal connected to the second terminal of the sixth transistor T6, and a second terminal connected to an output node NO.

The first output part 230 may output the third clock signal CLK3 as the scan signal SCAN in response to a voltage of the second set node NQ2. For example, in the data writing period, the input signal IN having the low level may be transferred to the first set node NQ1 and the second set node NQ2 in response to a pulse of the second clock signal CLK2, then the voltage of the second set node NQ2 may be boosted by a first capacitor C1 of the first output part 230 to a level lower than the low level at a next pulse of the third clock signal CLK3. In an example, the voltage of the second set node NQ2 may be boosted, for example, from about −8V to about −18.5V at the next pulse of the third clock signal CLK3. However, the inventive concept is not limited thereto. An eighth transistor T8 of the first output part 230 may output the third clock signal CLK3 having the low level as the scan signal SCAN in response to the boosted voltage of the second set node NQ2. In an exemplary embodiment of the inventive concept, the first output part 230 may include the eighth transistor T8 including a gate connected to the second set node NQ2, a first terminal receiving the third clock signal CLK3, and a second terminal connected to the output node NO, and the first capacitor C1 including a first electrode connected to the second set node NQ2 and a second electrode connected to the output node NO.

The second output part 240 may output the concurrent driving signal GCK as the scan signal SCAN in response to the voltage of the second reset node NQB2. For example, in the concurrent compensation period, when the concurrent driving signal GCK transitions from the high level to the low level, the voltage of the second reset node NQB2 may be boosted by a second capacitor C2 of the second output part 240 to a level lower than the low level. In an example, the voltage of the second reset node NQB2 may be boosted, for example, from about −8V to about −20V when the concurrent driving signal GCK transitions from the high level to the low level. However, the inventive concept is not limited thereto. A ninth transistor T9 of the second output part 240 may output the concurrent driving signal GCK having the low level as the scan signal SCAN in response to the boosted voltage of the second reset node NQB2. In an exemplary embodiment of the inventive concept, the second output part 240 may include the ninth transistor T9 including a gate connected to the second reset node NQB2, a first terminal receiving the concurrent driving signal GCK, and a second terminal connected to the output node NO, and the second capacitor C2 including a first electrode connected to the second reset node NQB2 and a second electrode receiving the concurrent driving signal GCK.

The first stress relieving transistor T10 may be connected between the first set node NQ1 and the second set node NQ2. In an exemplary embodiment of the inventive concept, the first stress relieving transistor T10 may include a gate receiving a gate on voltage VGL, a first terminal connected to the first set node NQ1, and a second terminal connected to the second set node NQ2. Further, in an exemplary embodiment of the inventive concept, the first stress relieving transistor T10 may be (e.g., always) turned on in response to the gate on voltage VGL (or a low gate voltage VGL) having the low level while the scan driver (e.g., 150) is powered on.

In an exemplary embodiment of the inventive concept, the first stress relieving transistor T10 may allow an absolute value of a voltage of the first set node NQ1 to be lower than an absolute value of the voltage of the second set node NQ2 when the voltage of the second set node NQ2 is boosted in the data writing period. In other words, in the data writing period, when the voltage of the second set node NQ2 is boosted to the level lower than the low level, the voltage of the first set node NQ1 may be boosted less than the voltage of the second set node NQ2 because of the first stress relieving transistor T10. For example, the boosted voltage of the voltage of the second set node NQ2 may be about −18.5V, but the boosted voltage of the first set node NQ1 may be about −6.5V. However, the inventive concept is not limited thereto.

In a case where the stage 200 does not include the first stress relieving transistor T10, or in a case where the first set node NQ1 and the second set node NQ2 are the same set node (or the same Q node), while a voltage of the set node is boosted, the input signal IN of about 8V may be applied to the first terminal of the first transistor T1, the boosted voltage of the set node of about −18.5V may be applied to the second terminal of the first transistor T1, the gate off voltage VGH of about 8V may be applied to the first terminal of the fifth transistor T5, and the boosted voltage of the set node of about −18.5V may be applied to the second terminal of the fifth transistor T5. Accordingly, a drain-source voltage of about 26.5V, or a high drain-source voltage stress may be applied to the first transistor T1 and the fifth transistor T5.

However, the stage 200 of the scan driver according to exemplary embodiments of the inventive concept may include the first stress relieving transistor T10 connected between the first set node NQ1 and the second set node NQ2, and thus may limit the voltage of the first set node NQ1 connected to the second terminals of the first and fifth transistors T1 and T5 to about −6.5V. Accordingly, a drain-source voltage of about 14.5V (instead of 26.5V) may be applied to the first and fifth transistors T1 and T5, and the drain-source voltage stress to the first and fifth transistors T1 and T5 may be relieved.

The second stress relieving transistor T11 may be connected between the first reset node NQB1 and the second reset node NQB2. In an exemplary embodiment of the inventive concept, the second stress relieving transistor T11 may include a gate receiving the gate on voltage VGL, a first terminal connected to the first reset node NQB1, and a second terminal connected to the second reset node NQB2. Further, in an exemplary embodiment of the inventive concept, the second stress relieving transistor T11 may be (e.g., always) turned on in response to the gate on voltage VGL (or the low gate voltage VGL) having the low level while the scan driver is powered on.

In an exemplary embodiment of the inventive concept, the second stress relieving transistor T11 may allow an absolute value of a voltage of the first reset node NQB1 to be lower than an absolute value of the voltage of the second reset node NQB2 when the voltage of the second reset node NQB2 is boosted in the concurrent compensation period. In other words, in the concurrent compensation period, when the voltage of the second reset node NQB2 is boosted to the level lower than the low level, the voltage of the first reset node NQB1 may be boosted less than the voltage of the second reset node NQB2 because of the second stress relieving transistor T11. For example, the boosted voltage of the voltage of the second reset node NQB2 may be about −20V, but the boosted voltage of the first reset node NQB1 may be about −7.5V. However, the inventive concept is not limited thereto.

In a case where the stage 200 does not include the second stress relieving transistor T11, or in a case where the first reset node NQB1 and the second reset node NQB2 are the same reset node (or the same QB node), while a voltage of the reset node is boosted, the first clock signal CLK1 of about 8V may be applied to the first terminal of the third transistor T3 through the second transistor T1 that is turned on in response to the previous scan signal PSCAN having the low level, the boosted voltage of the reset node of about −20V may be applied to the second terminal of the third transistor T3, the first clock signal CLK1 of about 8V may be applied to the first terminal of the fourth transistor T4, and the boosted voltage of the reset node of about −20V may be applied to the second terminal of the fourth transistor T4. Accordingly, a drain-source voltage of about 28V, or a high drain-source voltage stress may be applied to the third transistor T3 and the fourth transistor T4. In particular, although voltages of the set nodes of a plurality of stages 200 may be sequentially boosted for about 1H time per each stage in the data writing period, voltages of the reset nodes of the plurality of stages 200 may be boosted for, for example, about 100H time in the concurrent compensation period. Accordingly, the third transistor T3 and the fourth transistor T4 may be further degraded.

However, the stage 200 of the scan driver according to exemplary embodiments of the inventive concept may include the second stress relieving transistor T11 connected between the first reset node NQB1 and the second reset node NQB2, and thus may limit the voltage of the first reset node NQB1 connected to the second terminals of the third and fourth transistors T3 and T4 to about −7.5V. Accordingly, a drain-source voltage of about 15.5V (instead of 28V) may be applied to the third and fourth transistors T3 and T4, and the drain-source voltage stress to the third and fourth transistors T3 and T4 may be relieved.

FIG. 5 is a timing diagram for describing an operation of the scan driver of FIG. 4 according to an exemplary embodiment of the inventive concept, FIG. 6A is a diagram for describing a drain-source voltage stress in a stage excluding a first stress relieving transistor when a voltage of a set node is boosted, FIG. 6B is a diagram for describing a drain-source voltage stress in a stage according to an exemplary embodiment of the inventive concept when a voltage of a set node is boosted, FIG. 7A is a diagram for describing a drain-source voltage stress in a stage excluding a second stress relieving transistor when a voltage of a reset node is boosted, and FIG. 7B is a diagram for describing a drain-source voltage stress in a stage according to an exemplary embodiment of the inventive concept when a voltage of a reset node is boosted.

Referring to FIGS. 4 and 5, a display device according to exemplary embodiments of the inventive concept may be driven in a concurrent emission method where each frame includes a concurrent compensation period PSC in which a plurality of pixels included in the display device may concurrently (or simultaneously) perform threshold voltage compensation operations, a data driving period PSW in which data signals are sequentially written to the plurality of pixels on a row-by-row basis, and a concurrent emission period PSE in which the plurality of pixels may concurrently (or simultaneously) emit light.

In the data driving period PSW, a plurality of stages of a scan driver of the display device may sequentially output scan signals SCAN. For example, a first stage 200 may receive the start signal FLM as the input signal IN, and may receive the first through third input clock signals ICLK1, ICLK2, and ICLK3 as the first through third clock signals CLK1, CLK2, and CLK3, respectively. The first input part 210 of the first stage 200 may transfer the start signal FLM having a low level L to the first set node NQ1 in response to a pulse of the second input clock signal ICLK2. A voltage of the first set node NQ1 having the low level L may be transferred to the second set node NQ2 by the first stress relieving transistor T10 that is turned on in response to the gate on voltage VGL, and thus a voltage V_NQ2 of the second set node NQ2 may have the low level L. The second input part 220 of the first stage 200 may transfer the first input clock signal ICLK1 having a high level H to a first reset node NQB1 in response to the pulse of the second input clock signal ICLK2. A voltage of the first reset node NQB1 having the high level H may be transferred to a second reset node NQB2 by the second stress relieving transistor T11 that is turned on in response to the gate on voltage VGL, and thus a voltage V_NQB2 of the second reset node NQB2 may have the high level H.

At a next pulse of the third input clock signal ICLK3, or at a set node boosting time TQB, the voltage V_NQ2 of the second set node NQ2 may be boosted to a level 2L lower than the low level L by a first capacitor C1 of a first output part 230. For example, the voltage V_NQ2 of the second set node NQ2 may be boosted, for example, from the low level L of about −8V to the lower level 2L of about −18.5V. However, the inventive concept is not limited thereto.

As illustrated in FIG. 6A, in a case where a stage 200a does not include a first stress relieving transistor T10, or in a case where the first set node NQ1 and the second set node NQ2 are the same set node NQ, during the set node boosting time TQB, the input signal IN of about 8V may be applied to the first terminal of the first transistor T1, a boosted voltage of the set node NQ of about −18.5V may be applied to the second terminal of the first transistor T1, the gate off voltage VGH of about 8V may be applied to the first terminal of the fifth transistor T5, and the boosted voltage of the set node NQ of about −18.5V may be applied to the second terminal of the fifth transistor T5. Accordingly, a drain-source voltage of about 26.5V, or a high drain-source voltage stress may be applied to the first transistor T1 and the fifth transistor T5.

However, as illustrated in FIG. 6B, in the stage 200 including the first stress relieving transistor T10 according to an exemplary embodiment of the inventive concept, during the set node boosting time TQB, the voltage of the first set node NQ1 of about −6.5V may be applied to the second terminals of the first and fifth transistors T1 and T5. Accordingly, a drain-source voltage of about 14.5V (instead of 26.5V) may be applied to the first and fifth transistors T1 and T5, and the drain-source voltage stress to the first and fifth transistors T1 and T5 may be relieved.

At the pulse of the third input clock signal ICLK3, the first output part 230 of the first stage 200 may output the third input clock signal ICLK3 having the low level L as the scan signal SCAN in response to the voltage V_NQ2 of the second set node NQ2 having the boosted voltage level 2L. Further, a second stage next to the first stage 200 may receive the scan signal SCAN of the first stage 200 as the input signal IN in response to the pulse of the third input clock signal ICLK3.

At a next pulse of the fourth input clock signal ICLK4, the first output part 230 of the first stage 200 may output the third input clock signal ICLK3 having the high level H as the scan signal SCAN, and the voltage V_NQ2 of the second set node NQ2 may be increased to the low level L (or the absolute value of the voltage V_NQ2 may be lowered). Further, the second stage next to the first stage 200 may output the scan signal SCAN having the low level L in response to the pulse of the fourth input clock signal ICLK4, and a third stage next to the second stage may receive the scan signal SCAN of the second stage as the input signal IN in response to the pulse of the fourth input clock signal ICLK4.

At a next pulse of the first input clock signal ICLK1, the holding part 250 of the first stage 200 may transfer the first input clock signal ICLK1 having the low level L to the first reset node NQB1 in response to the pulse of the first input clock signal ICLK1. A voltage of the first reset node NQB1 having the low level L may be transferred to the second reset node NQB2 by the second stress relieving transistor T11, and thus the voltage V_NQB2 of the second reset node NQB2 may have the low level L. The third stage next to the second stage may output the scan signal SCAN having the low level L in response to the pulse of the first input clock signal ICLK1, and a fourth stage next to the third stage may receive the scan signal SCAN of the third stage as the input signal IN in response to the pulse of the first input clock signal ICLK1.

At a next pulse of the second input clock signal ICLK2, the first input part 210 of the first stage 200 may transfer the input signal IN having the high level H to the first set node NQ1 in response to the pulse of the second input clock signal ICLK2. A voltage of the first set node NQ1 having the high level H may be transferred to the second node NQ2 by the second stress relieving transistor T11, and thus the voltage V_NQ2 of the second set node NQ2 may have the high level H. The fourth stage next to the third stage may output the scan signal SCAN having the low level L in response to the pulse of the second input clock signal ICLK2, and a fifth stage next to the fourth stage may receive the scan signal SCAN of the fourth stage as the input signal IN in response to the pulse of the second input clock signal ICLK2. Similarly, in the data writing period PSW, the plurality of stages may sequentially output the scan signals SCAN.

In the concurrent compensation period PSC before the data writing period PSW, the plurality of stages may concurrently output the scan signals SCAN. To perform this operation, the concurrent driving signal GCK having the low level L may be concurrently applied to the plurality of stages. The concurrent driving controlling part 260 of each stage 200 may transfer the gate off voltage VGH having the high level H to the first set node NQ1 in response to the concurrent driving signal GCK. The voltage of the first set node NQ1 having the high level H may be transferred to the second set node NQ2 by the first stress relieving transistor T10, and thus the voltage V_NQ2 of the second set node NQ2 may have the high level H. The first output part 230 of each stage 200 may be deactivated in response to the voltage V_NQ2 of the second set node NQ2 having the high level H.

Further, while the concurrent driving signal GCK has the low level L, or during a reset node boosting time TQBB, the voltage V_NQB2 of the second reset node NQB2 may be boosted to the lower level 2L by the second capacitor C2 of the second output part 240. For example, the voltage V_NQB2 of the second reset node NQB2 may have the lower level 2L of about −20V. However, the inventive concept is not limited thereto.

As illustrated in FIG. 7A, in a case where a stage 200b does not include the second stress relieving transistor T11, or in a case where the first reset node NQB1 and the second reset node NQB2 are the same reset node NQB, during the reset node boosting time TQBB, the first clock signal CLK1 of about 8V may be applied to a first terminal of the third transistor T3, a boosted voltage of the reset node NQB of about −20V may be applied to a second terminal of the third transistor T3, the first clock signal CLK1 of about 8V may be applied to a first terminal of the fourth transistor T4, and the boosted voltage of the reset node NQB of about −20V may be applied to a second terminal of the fourth transistor T4. Accordingly, a drain-source voltage of about 28V, or a high drain-source voltage stress may be applied to the third transistor T3 and the fourth transistor T4.

However, as illustrated in FIG. 7B, in the stage 200 including the second stress relieving transistor T11 according to an exemplary embodiment of the inventive concept, during the reset node boosting time TQBB, the voltage of first reset node NQB1 of about −7.5V to the second terminals of the third and fourth transistors T3 and T4. Accordingly, not the drain-source voltage of about 28V but a drain-source voltage of about 15.5V may be applied to the third and fourth transistors T3 and T4, and the drain-source voltage stress to the third and fourth transistors T3 and T4 may be relieved.

Figure 8:
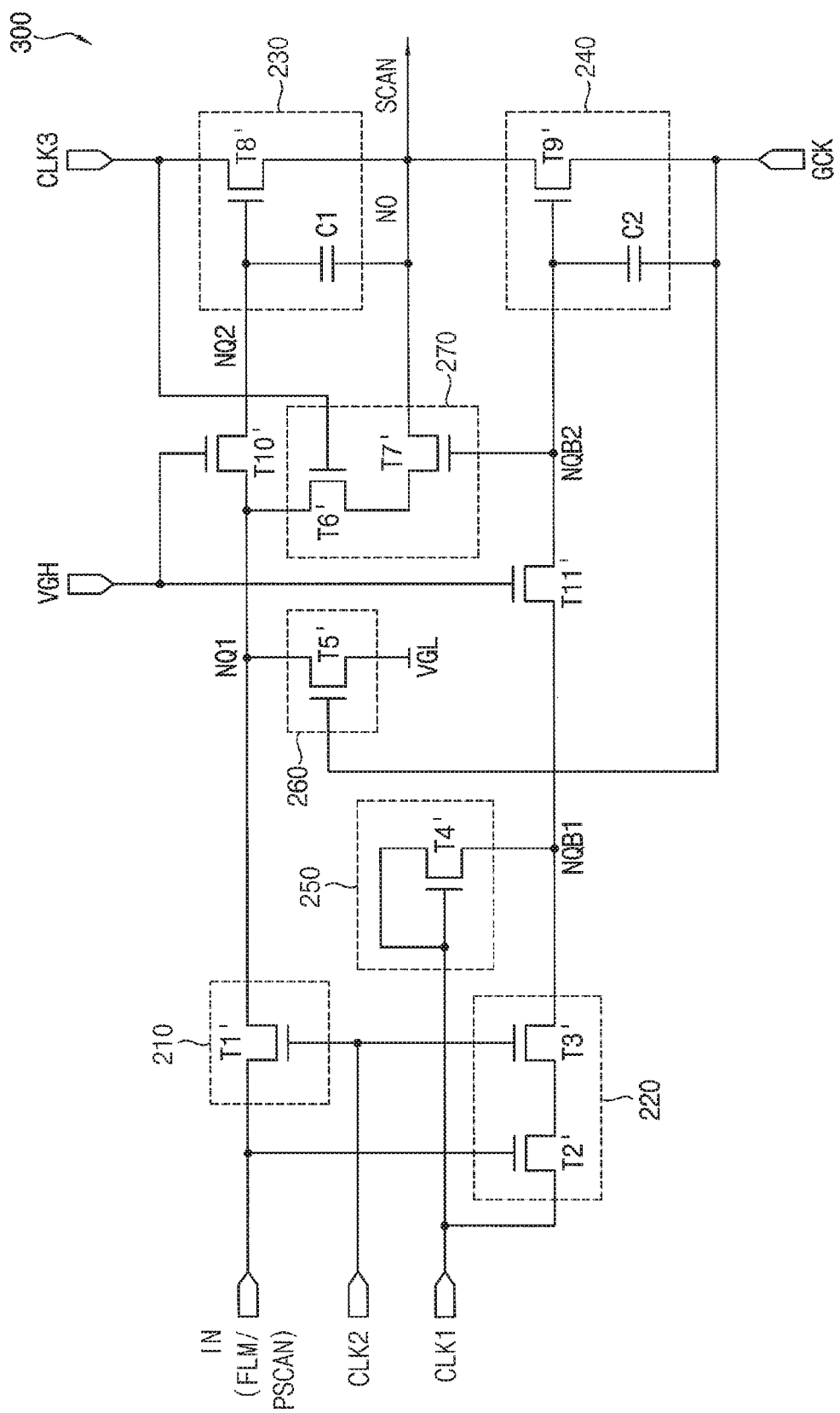
FIG. 8 is a circuit diagram illustrating a stage included in a scan driver according to an exemplary embodiment of the inventive concept.

FIG. 8 is a circuit diagram illustrating a stage included in a scan driver according to an exemplary embodiment of the inventive concept.

Referring to FIG. 8, a stage 300 may include first through eleventh transistors T1', T2', T3', T4', T5', T6', T7', T8', T9', T10', and T11' and first and second capacitors C1 and C2. The stage 300 of FIG. 8 may have substantially the same configuration and operation as those of the stage 200 of FIG. 4, except that the first through eleventh transistors T1', T2', T3', T4', T5', T6', T7', T8', T9', T10', and T11' may be implemented as not PMOS transistors but NMOS transistors, a voltage of a high level (e.g., the high gate voltage VGH) may be used as a voltage of an active level (e.g., a gate on voltage), and a voltage of a low level (e.g., the low gate voltage VGL) may be used as a voltage of an inactive level (e.g., a gate off voltage).

The stage 300 may include the tenth transistor T10' connected between the first set node NQ1 and the second set node NQ2, and the eleventh transistor T11' connected between the first reset node NQB1 and the second reset node NQB2, thus relieving a drain-source voltage stress to at least one transistor (e.g., first, third, fourth and fifth transistors T1', T3', T4', and T5') of the stage 300.

Figure 9:
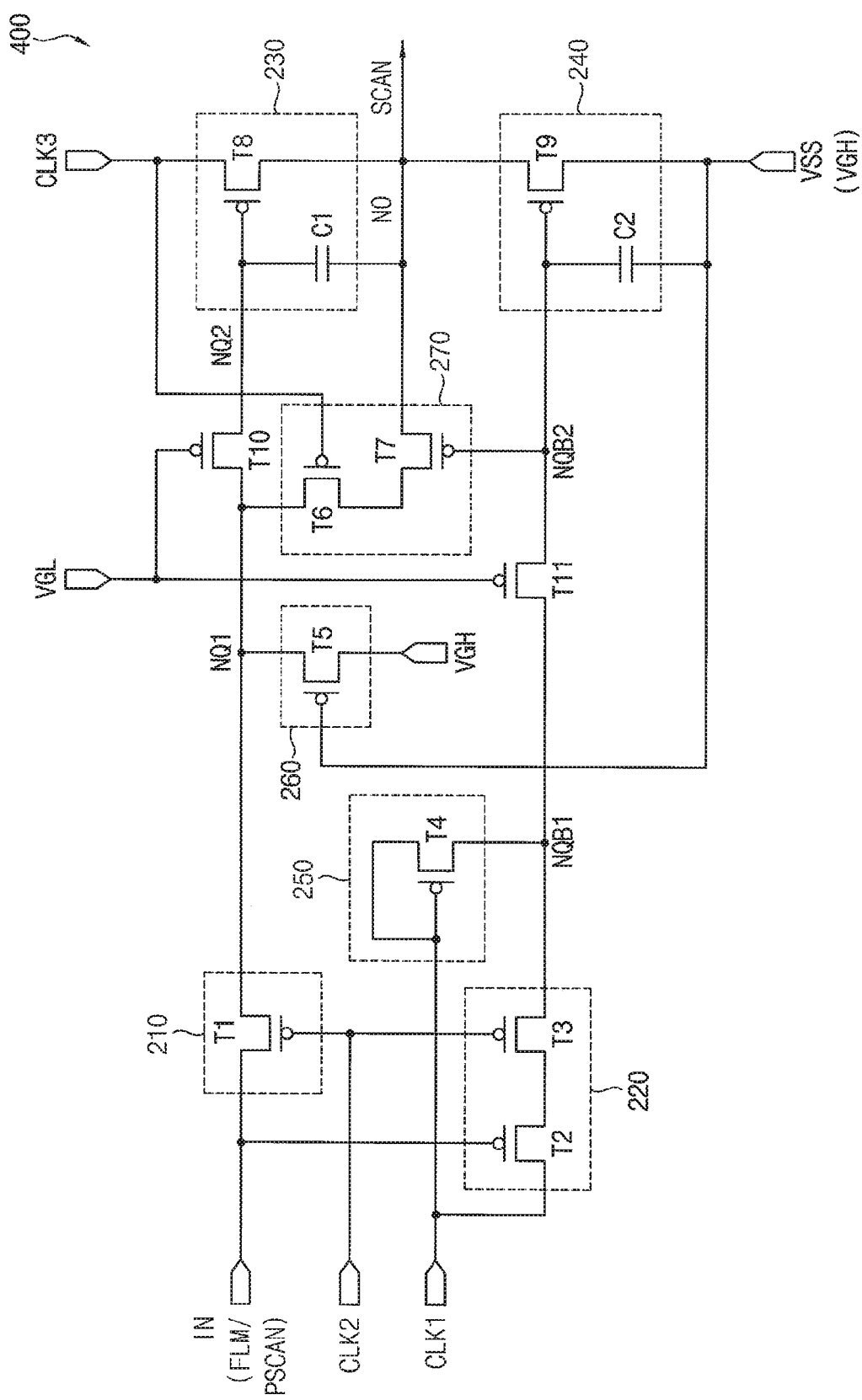
FIG. 9 is a circuit diagram illustrating a stage included in a scan driver according to an exemplary embodiment of the inventive concept.

FIG. 9 is a circuit diagram illustrating a stage included in a scan driver according to an exemplary embodiment of the inventive concept.

A stage 400 of FIG. 9 may have substantially the same configuration and operation as those of the stage 200 of FIG. 4, except that a gate off voltage VSS may be used instead of the concurrent driving signal GCK. In an exemplary embodiment of the inventive concept, a scan driver including the stage 400 of FIG. 9 may be included in a display device driven in a progressive emission method. The second output part 240 of the stage 400 may output the gate off voltage VSS as the scan signal SCAN in response to a voltage of the second reset node NQB2. In an exemplary embodiment of the inventive concept, the gate off voltage VSS may be the high gate voltage VGH.

The stage 400 may include a tenth transistor T10 connected between the first set node NQ1 and the second set node NQ2, and an eleventh transistor T11 connected between the first reset node NQB1 and the second reset node NQB2, thus relieving a drain-source voltage stress to at least one transistor (e.g., first, third, fourth, and fifth transistors T1, T3, T4, and T5) of the stage 400.

Figure 10:
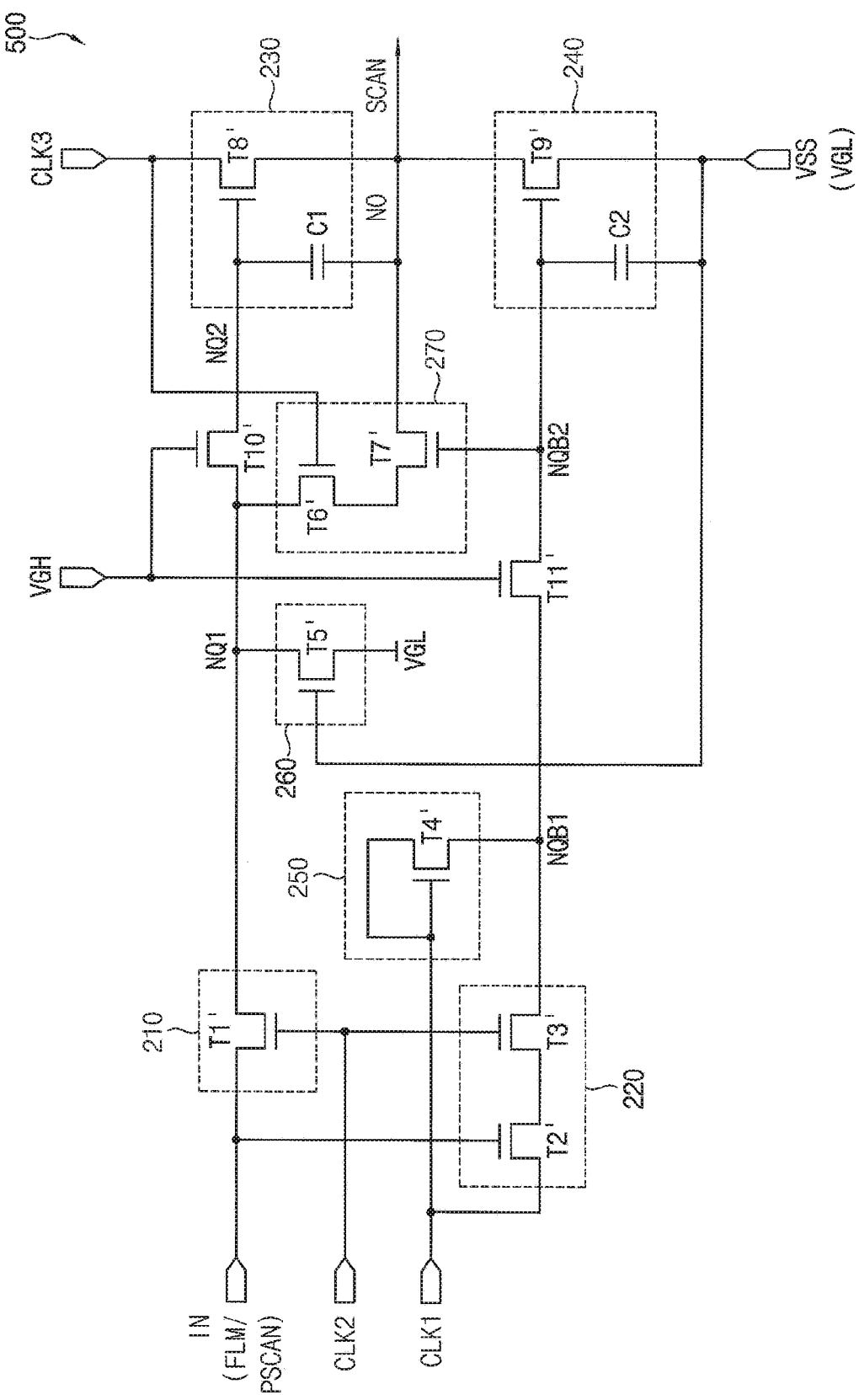
FIG. 10 is a circuit diagram illustrating a stage included in a scan driver according to an exemplary embodiment of the inventive concept.

FIG. 10 is a circuit diagram illustrating a stage included in a scan driver according to an exemplary embodiment of the inventive concept.

A stage 500 of FIG. 10 may have substantially the same configuration and operation as those of the stage 300 of FIG. 8, except that the gate off voltage VSS may be used instead of the concurrent driving signal GCK. In an exemplary embodiment of the inventive concept, a scan driver including the stage 500 of FIG. 10 may be included in a display device driven in a progressive emission method. The second output part 240 of the stage 500 may output the gate off voltage VSS as the scan signal SCAN in response to a voltage of a second reset node NQB2. In an exemplary embodiment of the inventive concept, the gate off voltage VSS may be the low gate voltage VGL.

The stage 500 may include a tenth transistor T10' connected between the first set node NQ1 and the second set node NQ2, and an eleventh transistor T11 connected between the first reset node NQB1 and the second reset node NQB2, thus relieving a drain-source voltage stress to at least one transistor (e.g., first, third, fourth, and fifth transistors T1', T3', T4', and T5') of the stage 500.

Figure 11:
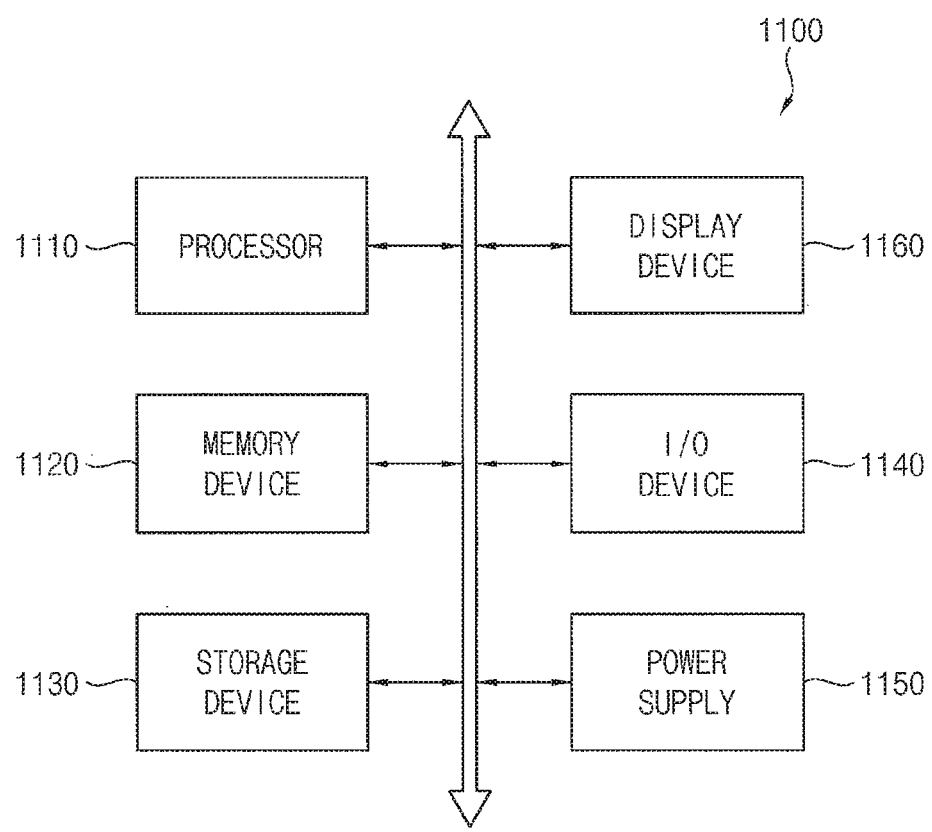
FIG. 11 is a block diagram illustrating an electronic device including a display device according to an exemplary embodiment of the inventive concept.
Figure 12:
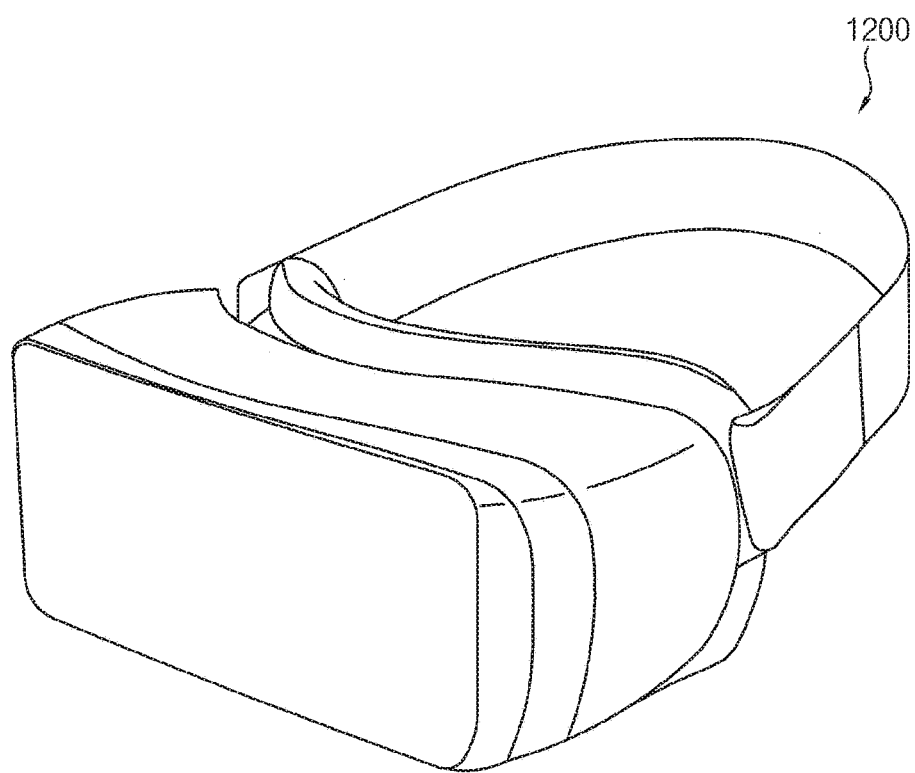
FIG. 12 is a block diagram illustrating an example where the electronic device of FIG. 11 is implemented as a head-mounted display (HMD) according to an exemplary embodiment of the inventive concept.

FIG. 11 is a block diagram illustrating an electronic device including a display device according to an exemplary embodiment of the inventive concept, and FIG. 12 is a block diagram illustrating an example where the electronic device of FIG. 11 is implemented as a head-mounted display (HMD) according to an exemplary embodiment of the inventive concept.

Referring to FIG. 11, an electronic device 1100 may include a processor 1110, a memory device 1120, a storage device 1130, an input/output (I/O) device 1140, a power supply 1150, and a display device 1160. The electronic device 1100 may further include a plurality of ports for communicating with a video card, a sound card, a memory card, a universal serial bus (USB) device, other electric devices, etc.

The processor 1110 may perform various computing functions or tasks. The processor 1110 may be an application processor (AP), a micro processor, a central processing unit (CPU), etc. The processor 1110 may be coupled to other components via an address bus, a control bus, a data bus, etc. Further, in an exemplary embodiment of the inventive concept, the processor 1110 may be further coupled to an extended bus such as a peripheral component interconnect (PCI) bus.

The memory device 1120 may store data for operations of the electronic device 1100. For example, the memory device 1120 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile dynamic random access memory (mobile DRAM) device, etc.

The storage device 1130 may be a solid state drive (SSD) device, a hard disk drive (HDD) device, a CD-ROM device, etc. The I/O device 1140 may be an input device such as a keyboard, a keypad, a mouse, a touch screen, etc., and/or an output device such as a printer, a speaker, etc. The power supply 1150 may supply power for operations of the electronic device 1100.

The display device 1160 may include a display panel, a data driver outputting data signals to the display panel, and a scan driver outputting a plurality of scan signals to the display panel. The scan driver may include a plurality of stages that concurrently output the plurality of scan signals in a concurrent compensation period and that sequentially output plurality of scan signals in a data writing period. Each stage of the scan driver may include a first stress relieving transistor connected between a first set node and a second set node, and a second stress relieving transistor connected between a first reset node and a second reset node, thus relieving a drain-source voltage stress to at least one transistor of the stage.

In an exemplary embodiment of the inventive concept, as illustrated in FIG. 12, the electronic device 1100 may be implemented as a head-mounted display (HMD) 1200. However, the electronic device 1100 according to exemplary embodiments of the inventive concept may not be limited to the HMD 1200. For example, the electronic device 1100 may be any electronic device including the display device 1160, such as a virtual reality (VR) device, a cellular phone, a smart phone, a tablet computer, a wearable device, a personal digital assistant (PDA), a portable multimedia player (PMP), a digital camera, a music player, a portable game console, a navigation system, a digital television, a 3D television, a personal computer (PC), a home appliance, a laptop computer, etc.

As described above, in the scan driver and the display device according to exemplary embodiments of the inventive concept, each stage may include the first stress relieving transistor connected between the first set node and the second set node and the second stress relieving transistor connected between the first reset node and the second reset node, thus relieving drain-source voltage stresses for transistors included in the scan driver.

While the inventive concept has been shown and described above with reference to exemplary embodiments thereof, it will be apparent to those of ordinary skill in the art that modifications and variations in form and details may be made thereto without departing from the spirit and scope of the inventive concept as set forth by the following claims.

What is claimed is:

1. A scan driver associated with a display device and comprising a plurality of stages concurrently outputting a plurality of scan signals in a concurrent compensation period and sequentially outputting the plurality of scan signals in a data writing period that is distinct from the concurrent compensation period, each of the plurality of stages comprising:
   a first input part configured to transfer an input signal to a first set node in response to a second clock signal;
   a second input part configured to transfer a first clock signal to a first reset node in response to the input signal and the second clock signal;
   a first output part configured to output a third clock signal as a respective scan signal in response to a voltage of a second set node;
   a second output part configured to output a concurrent driving signal as the respective scan signal in response to a voltage of a second reset node;
   a first stress relieving transistor connected between the first set node and the second set node; and
   a second stress relieving transistor connected between the first reset node and the second reset node;
   wherein the first stress relieving transistor is configured to allow an absolute value of a voltage of the first set node to be lower than an absolute value of the voltage of the second set node when the voltage of the second set node is boosted in the data writing period during which data signals are written to the display device, thereby relieving drain-source voltage stress for one or more transistors in the stage during the data writing period; and
   wherein the second stress relieving transistor is configured to allow an absolute value of a voltage of the first reset node to be lower than an absolute value of the voltage of the second reset node when the voltage of the second reset node is boosted in the concurrent compensation period during which threshold voltage compensation operations are performed in association with the display device, thereby relieving drain-source voltage stress for one or more transistors in the stage during the concurrent compensation period.

2. The scan driver of claim 1, wherein the first stress relieving transistor and the second stress relieving transistor are turned on in response to a gate on voltage while the scan driver is powered on.

3. The scan driver of claim 1, wherein the first stress relieving transistor includes a gate configured to receive a gate on voltage, a first terminal connected to the first set node, and a second terminal connected to the second set node.

4. The scan driver of claim 1, wherein the second stress relieving transistor includes a gate configured to receive a gate on voltage, a first terminal connected to the first reset node, and a second terminal connected to the second reset node.

5. The scan driver of claim 1, wherein the first input part includes:
   a first transistor including a gate configured to receive the second clock signal, a first terminal configured to receive the input signal, and a second terminal connected to the first set node.

6. The scan driver of claim 1, wherein the second input part includes:
   a second transistor including a gate configured to receive the input signal, a first terminal configured to receive the first clock signal, and a second terminal; and
   a third transistor including a gate configured to receive the second clock signal, a first terminal connected to the second terminal of the second transistor, and a second terminal connected to the first reset node.

7. The scan driver of claim 1, wherein each of the plurality of stages further comprises:
   a holding part configured to hold a voltage of the first reset node in response to the first clock signal.

8. The scan driver of claim 7, wherein the holding part includes:
   a fourth transistor including a gate configured to receive the first clock signal, a first terminal configured to receive the first clock signal, and a second terminal connected to the first reset node.

9. The scan driver of claim 1, wherein each of the plurality of stages further comprises:
   a concurrent driving controlling part configured to deactivate the first output part in response to the concurrent driving signal.

10. The scan driver of claim 9, wherein the concurrent driving controlling part includes:
a fifth transistor including a gate configured to receive the concurrent driving signal, a first terminal configured to receive a gate off voltage, and a second terminal connected to the first set node.

11. The scan driver of claim 1, wherein each of the plurality of stages further comprises:
a stabilizing part configured to stabilize the respective scan signal in response to the voltage of the second reset node and the third clock signal.

12. The scan driver of claim 11, wherein the stabilizing part includes:
a sixth transistor including a gate configured to receive the third clock signal, a first terminal connected to the first set node, and a second terminal; and
a seventh transistor including a gate connected to the second reset node, a first terminal connected to the second terminal of the sixth transistor, and a second terminal connected to an output node.

13. The scan driver of claim 1, wherein the first output part includes:
an eighth transistor including a gate connected to the second set node, a first terminal configured to receive the third clock signal, and a second terminal connected to an output node; and
a first capacitor including a first electrode connected to the second set node and a second electrode connected to the output node.

14. The scan driver of claim 1, wherein the second output part includes:
a ninth transistor including a gate connected to the second reset node, a first terminal configured to receive the concurrent driving signal, and a second terminal connected to an output node; and
a second capacitor including a first electrode connected to the second reset node and a second electrode configured to receive the concurrent driving signal.

15. A scan driver associated with a display device and comprising a plurality of stages concurrently outputting a plurality of scan signals in a concurrent compensation period and sequentially outputting the plurality of scan signals in a data writing period that is distinct from the concurrent compensation period, each of the plurality of stages comprising:
a first transistor including a gate configured to receive a second clock signal, a first terminal configured to receive an input signal, and a second terminal connected to a first set node;
a second transistor including a gate configured to receive the input signal, a first terminal configured to receive a first clock signal, and a second terminal;
a third transistor including a gate configured to receive the second clock signal, a first terminal connected to the second terminal of the second transistor, and a second terminal connected to a first reset node;
an eighth transistor including a gate connected to a second set node, a first terminal configured to receive a third clock signal, and a second terminal connected to an output node;
a first capacitor including a first electrode connected to the second set node and a second electrode connected to the output node;
a ninth transistor including a gate connected to a second reset node, a first terminal configured to receive a concurrent driving signal, and a second terminal connected to the output node;
a second capacitor including a first electrode connected to the second reset node and a second electrode configured to receive the concurrent driving signal;
a tenth transistor including a gate configured to receive a gate on voltage, a first terminal connected to the first set node, and a second terminal connected to the second set node; and
an eleventh transistor including a gate configured to receive the gate on voltage, a first terminal connected to the first reset node, and a second terminal connected to the second reset node;
wherein the tenth transistor is configured to allow an absolute value of a voltage of the first set node to be lower than an absolute value of a voltage of the second set node when the voltage of the second set node is boosted in the data writing period during which data signals are written to the display device, thereby relieving drain-source voltage stress for one or more transistors in the stage during the data writing period; and
wherein the eleventh transistor is configured to allow an absolute value of a voltage of the first reset node to be lower than an absolute value of a voltage of the second reset node when the voltage of the second reset node is boosted in the concurrent compensation period during which threshold voltage compensation operations are performed in association with the display device, thereby relieving drain-source voltage stress for one or more transistors in the stage during the concurrent compensation period.

16. The scan driver of claim 15, wherein each of the plurality of stages further comprises:
a fourth transistor including a gate configured to receive the first clock signal, a first terminal configured to receive the first clock signal, and a second terminal connected to the first reset node;
a fifth transistor including a gate configured to receive the concurrent driving signal, a first terminal configured to receive a gate off voltage, and a second terminal connected to the first set node;
a sixth transistor including a gate configured to receive the third clock signal, a first terminal connected to the first set node, and a second terminal; and
a seventh transistor including a gate connected to the second reset node, a first terminal connected to the second terminal of the sixth transistor, and a second terminal connected to the output node.

17. A display device, comprising:
a display panel including a plurality of data lines, a plurality of scan lines, and a plurality of pixels connected to the plurality of data lines and the plurality of scan lines;
a data driver configured to output data signals to the plurality of data lines;
a scan driver including a plurality of stages concurrently outputting to the plurality of scan lines a plurality of scan signals in a concurrent compensation period and sequentially outputting the plurality of scan signals in a data writing period that is distinct from the concurrent compensation period, each of the plurality of stages comprising:
a first input part configured to transfer an input signal to a first set node in response to a second clock signal;
a second input part configured to transfer a first clock signal to a first reset node in response to the input signal and the second clock signal;

a first output part configured to output a third clock signal as a respective scan signal in response to a voltage of a second set node;

a second output part configured to output a concurrent driving signal as the respective scan signal in response to a voltage of a second reset node;

a first stress relieving transistor connected between the first set node and the second set node; and a second stress relieving transistor connected between the first reset node and the second reset node;

wherein the first stress relieving transistor is configured to allow an absolute value of a voltage of the first set node to be lower than an absolute value of the voltage of the second set node when the voltage of the second set node is boosted in the data writing period during which data signals are written to the display device, thereby relieving drain-source voltage stress for one or more transistors in the stage during the data writing period; and wherein the second stress relieving transistor is configured to allow an absolute value of a voltage of the first reset node to be lower than an absolute value of the voltage of the second reset node when the voltage of the second reset node is boosted in the concurrent compensation period during which threshold voltage compensation operations are performed in association with the display device, thereby relieving drain-source voltage stress for one or more transistors in the stage during the concurrent compensation period.

* * * * *